US011217283B2

(12) United States Patent
Lee et al.

(10) Patent No.: US 11,217,283 B2
(45) Date of Patent: *Jan. 4, 2022

(54) MULTI-CHIP PACKAGE WITH REDUCED CALIBRATION TIME AND ZQ CALIBRATION METHOD THEREOF

(71) Applicant: Samsung Electronics Co., Ltd., Suwon-si (KR)

(72) Inventors: Junha Lee, Seoul (KR); Seonkyoo Lee, Hwaseong-si (KR); Jeongdon Ihm, Seongnam-si (KR); Byunghoon Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/012,845

(22) Filed: Sep. 4, 2020

(65) Prior Publication Data

US 2021/0065753 A1 Mar. 4, 2021

Related U.S. Application Data

(63) Continuation-in-part of application No. 16/834,025, filed on Mar. 30, 2020.

(30) Foreign Application Priority Data

Sep. 3, 2019 (KR) .......................... 10-2019-0108936

(51) Int. Cl.
*G11C 7/10* (2006.01)
*H01L 25/065* (2006.01)
(Continued)

(52) U.S. Cl.
CPC ............ *G11C 7/1057* (2013.01); *H01L 24/08* (2013.01); *H01L 25/0652* (2013.01);
(Continued)

(58) Field of Classification Search
CPC ..... G11C 16/06; H01L 23/66; H01L 25/0657; H01L 25/18; H01L 2224/48106;
(Continued)

(56) References Cited

U.S. PATENT DOCUMENTS 6,492,853 B1 12/2002 Latham et al.
7,194,559 B2 3/2007 Salmon et al.
(Continued)

FOREIGN PATENT DOCUMENTS

KR 10-0974224 B1 8/2010
KR 10-2018-0065228 A 6/2018

OTHER PUBLICATIONS

Notice of Allowance dated May 21, 2021, issued in corresponding U.S. Appl. No. 16/834,025.
(Continued)

*Primary Examiner* — Fernando Hidalgo
(74) *Attorney, Agent, or Firm* — Harness, Dickey & Pierce, PLC

(57) ABSTRACT

A multi-chip package with reduced calibration time and an impedance control (ZQ) calibration method thereof are provided. A master chip of the multi-chip package performs a first ZQ calibration operation by using a ZQ resistor, and then, the other slave chips simultaneously perform second ZQ calibration operations with respect to data input/output (DQ) pads of the slave chips by using a termination resistance value of a DQ pad of the master chip on the basis of a one-to-one correspondence relationship with the DQ pad of the master chip. The multi-chip package completes ZQ calibration by performing two ZQ calibration operations, thereby decreasing a ZQ calibration time.

11 Claims, 18 Drawing Sheets

(51) Int. Cl.
*H01L 25/18* (2006.01)
*H01L 23/00* (2006.01)

(52) U.S. Cl.
CPC .......... *H01L 25/0657* (2013.01); *H01L 25/18* (2013.01); *G11C 2207/2254* (2013.01); *H01L 2224/08145* (2013.01); *H01L 2225/0651* (2013.01); *H01L 2225/06506* (2013.01); *H01L 2225/06562* (2013.01); *H01L 2225/06586* (2013.01); *H01L 2924/1431* (2013.01); *H01L 2924/1434* (2013.01)

(58) Field of Classification Search
CPC ........... H01L 24/48; H01L 2224/48091; H01L 2224/48235; H01L 2225/06586; H01L 2225/06562; H01L 2224/48145; H01L 2225/06506; H01L 2223/6611; H01L 2225/0651; H01L 2924/14511
USPC .................................................... 365/185.17
See application file for complete search history.

(56) References Cited

U.S. PATENT DOCUMENTS

| | | | |
|---|---|---|---|
| 7,679,133 B2 | 3/2010 | Son et al. | |
| 7,728,619 B1 | 6/2010 | Tzou et al. | |
| 8,488,381 B2 | 7/2013 | Kim et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,917,110 B2 | 12/2014 | Ko | |
| 8,937,488 B2 | 1/2015 | Riho | |
| 9,548,316 B2 * | 1/2017 | Lim | H01L 27/11575 |
| 9,666,289 B2 * | 5/2017 | Lee | H01L 27/11556 |
| 9,805,769 B2 | 10/2017 | Lee et al. | |
| 9,825,631 B1 | 11/2017 | Cho et al. | |
| 9,917,061 B2 | 3/2018 | Byeon | |
| 10,090,064 B2 | 10/2018 | Pan | |
| 10,255,969 B2 | 4/2019 | Eom et al. | |
| 10,276,220 B2 | 4/2019 | Jeon et al. | |
| 2011/0233648 A1 | 9/2011 | Seol et al. | |
| 2014/0334232 A1 | 11/2014 | Nam et al. | |
| 2018/0158809 A1 | 6/2018 | Kim et al. | |
| 2019/0158320 A1 | 5/2019 | Kwon et al. | |

OTHER PUBLICATIONS

Extended European Search Report dated Nov. 9, 2020 for corresponding European Application No. 20184824.9.

* cited by examiner

MULTI-CHIP PACKAGE WITH REDUCED CALIBRATION TIME AND ZQ CALIBRATION METHOD THEREOF

CROSS-REFERENCE TO RELATED APPLICATION

This U.S. non-provisional patent application is a continuation in part of U.S. application Ser. No. 16/834,025 filed Mar. 30, 2020, which claims the benefit of Korean Patent Application No. 10-2019-0108936, filed on Sep. 3, 2019, in the Korean Intellectual Property Office, the disclosure of each of which is incorporated herein in its entirety by reference.

BACKGROUND

1. Field

At least some example embodiments of the inventive concepts relate to a semiconductor device, and more particularly, to a multi-chip package in which a ZQ calibration operation is performed twice. For example, a master chip of a plurality of memory chips in the multi-chip package performs a ZQ calibration operation and then the other slave chips perform ZQ calibration operations simultaneously, thereby decreasing a calibration time.

2. Related Art

Electronic devices include a plurality of semiconductor integrated circuits (or semiconductor chips) and have a complicated hardware configuration. According to the demand for miniaturization and weigh reduction of electronic devices, a multi-chip package including a plurality of semiconductor chips equipped in one package has been provided for decreasing the number of elements mounted in electronic devices. Also, a swing width of each signal is reduced for minimizing a transfer time of each of the signals transmitted between semiconductor chips. As a swing width of each signal is reduced, an influence of external noise on semiconductor chips increases, and signal reflection caused by an impedance mismatch is severe in an interface. In order to solve the impedance mismatch, semiconductor chips include a ZQ pin and receive a ZQ calibration command from the outside to perform the ZQ calibration operation, thereby controlling the impedance mismatch.

As high-capacity memory is needed, multi-chip packages wherein a plurality of memory chips (or dies) operating independently through different channels are equipped in one package are provided. In a multi-chip package channel, each memory chip performs the ZQ calibration operation on signal lines through which a command, an address, and data of a corresponding memory chip are transferred. In this case, the ZQ calibration operation has to be performed a plurality of times equal to the number of memory chips equipped in a multi-chip package. For example, when eight memory chips are equipped in a multi-chip package, the ZQ calibration operation has to be performed eight times, and each of the eight memory chips has to complete the ZQ calibration operation during a ZQ calibration time defined in the package specification.

However, in a case where the ZQ calibration operation has to be performed a plurality of times equal to the number of memory chips equipped in a multi-chip package, a ZQ calibration command has to be sequentially input to each of the memory chips, and a time taken in waiting for sequentially performing the ZQ calibration operation based on a calibration command of a corresponding memory chip is too long.

SUMMARY

At least some example embodiments of the inventive concepts provide a multi-chip package and a ZQ calibration method thereof, in which a ZQ calibration operation is performed twice. For example, a master chip of a plurality of memory chips of the multi-chip package performs a ZQ calibration operation once and the other slave chips simultaneously perform ZQ calibration operations once, thereby decreasing a calibration time.

A multi-chip package includes a printed circuit board; and a plurality of memory chips stacked on the printed circuit board and including a master memory chip and a plurality of slave memory chips, each of the plurality of memory chips including an impedance control (ZQ) pad and a plurality of data input/output (DQ) pads, wherein the master memory chip is configured to perform a first ZQ calibration operation with respect to a ZQ pad of the master memory chip by using a ZQ resistor connected to a ZQ terminal of the multi-chip package and control termination resistance values of the DQ pads of the master memory chip on the basis of a result of the first ZQ calibration operation, and each slave memory chip from among the plurality of slave chips is configured to perform second ZQ calibration operations with respect to DQ pads of first to $m^{th}$ slave memory chips from among the plurality of slave memory chips by using termination resistance values of first to $m^{th}$ DQ pads from among the plurality of DQ pads of the master memory chip on the basis of a ZQ calibration option set between the first to $m^{th}$ DQ pads of the master memory chip and DQ pads of the first to $m^{th}$ slave memory chips, m being an integer greater than 1.

A multi-chip package includes a printed circuit board; a buffer chip on the printed circuit board, the buffer chip including a first impedance control (ZQ) pad and first data input/output (DQ) pads; and a plurality of memory chips stacked on the printed circuit board and arranged apart from the buffer chip, each of the plurality of memory chips including a second ZQ pad and second DQ pads, wherein the buffer chip is configured to perform a first ZQ calibration operation with respect to the first ZQ pad by using a ZQ resistor connected to the first ZQ pad, and to control termination resistance values of the first DQ pads of the buffer chip on the basis of a result of the first ZQ calibration operation, and wherein each of the plurality of memory chips is configured to perform second ZQ calibration operations with respect to the second DQ pads of a corresponding memory chip from among the plurality of memory chips by using a termination resistance value of a corresponding DQ pad of the buffer chip on the basis of a ZQ calibration option set between the first DQ pads of the buffer chip and the second DQ pads of the corresponding memory chip.

According to at least some example embodiments of the inventive concepts, there is provided an impedance control (ZQ) calibration method of a multi-chip package including a plurality of memory chips, the ZQ calibration method including performing a first ZQ calibration operation with respect to a ZQ pad by using a ZQ resistor connected to the ZQ pad in a master memory chip of the plurality of memory chips, controlling termination resistance values of data input/output (DQ) pads of the master memory chip on the basis of a result of the first ZQ calibration operation in the master memory chip, and performing second ZQ calibration operations with respect to DQ pads of first to $m^{th}$ slave memory chips by using termination resistance values of first to $m^{th}$ DQ pads of the master memory chip on the basis of a ZQ calibration option set between the DQ pads of the master memory chip and the DQ pads of the slave memory chips in each of slave memory chips, other than the master memory chip, of the plurality of memory chips.

According to at least some example embodiments of the inventive concepts, there is provided an impedance control (ZQ) calibration method of a multi-chip package including a plurality of memory chips, the ZQ calibration method including performing a first ZQ calibration operation with respect to a ZQ pad of a buffer chip by using a ZQ resistor connected to a ZQ terminal of the multi-chip package in the buffer chip of the multi-chip package, controlling termination resistance values of data input/output (DQ) pads of the buffer chip on the basis of a result of the first ZQ calibration operation in the buffer chip, and performing second ZQ calibration operations with respect to DQ pads of a corresponding memory chip by using a termination resistance value of a corresponding DQ pad of the buffer chip on the basis of a ZQ calibration option set between the DQ pads of the buffer chip and the DQ pads of the corresponding memory chip in each of the plurality of memory chips.

A multi-chip package includes a printed circuit board; and a plurality of memory chips stacked on the printed circuit board and including a master memory chip and a plurality of slave memory chips, each of the plurality of memory chips including a memory cell region including a first metal pad, a peripheral circuit region including a second metal pad and vertically connected to the memory cell region by the first metal pad and the second metal pad, an impedance control (ZQ) pad, and a plurality of data input/output (DQ) pads, wherein the master memory chip is configured to perform a first ZQ calibration operation on a ZQ pad of the master memory chip by using a ZQ resistor connected to a ZQ terminal of the multi-chip package and control termination resistance values of the plurality of DQ pads of the master memory chip on the basis of a result of the first ZQ calibration operation, and each slave memory chip of the plurality of slave chips is configured to perform second ZQ calibration operations on DQ pads of first to $m^{th}$ slave memory chips of the plurality of slave memory chips by using termination resistance values of first to $m^{th}$ DQ pads of the plurality of DQ pads of the master memory chip based on a ZQ calibration option set between the first to $m^{th}$ DQ pads of the master memory chip and the DQ pads of the first to $m^{th}$ slave memory chips, m being an integer greater than 1.

A multi-chip package includes a printed circuit board; a buffer chip provided on the printed circuit board, the buffer chip including a first impedance control (ZQ) pad and first data input/output (DQ) pads; and a plurality of memory chips stacked on the printed circuit board and arranged apart from the buffer chip, each of the plurality of memory chips including a memory cell region including a first metal pad, a peripheral circuit region including a second metal pad and vertically connected to the memory cell region by the first metal pad and the second metal pad, a second ZQ pad, and a plurality of second DQ pads, wherein the buffer chip is configured to perform a first ZQ calibration operation on the first ZQ pad by using a ZQ resistor connected to the first ZQ pad, and to control termination resistance values of the first DQ pads of the buffer chip based on a result of the first ZQ calibration operation, and wherein each of the plurality of memory chips is configured to perform second ZQ calibration operations on the second DQ pads of a corresponding memory chip from among the plurality of memory chips by using a termination resistance value of a corresponding DQ pad of the buffer chip based on a ZQ calibration option set between the first DQ pads of the buffer chip and the second DQ pads of the corresponding memory chip.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
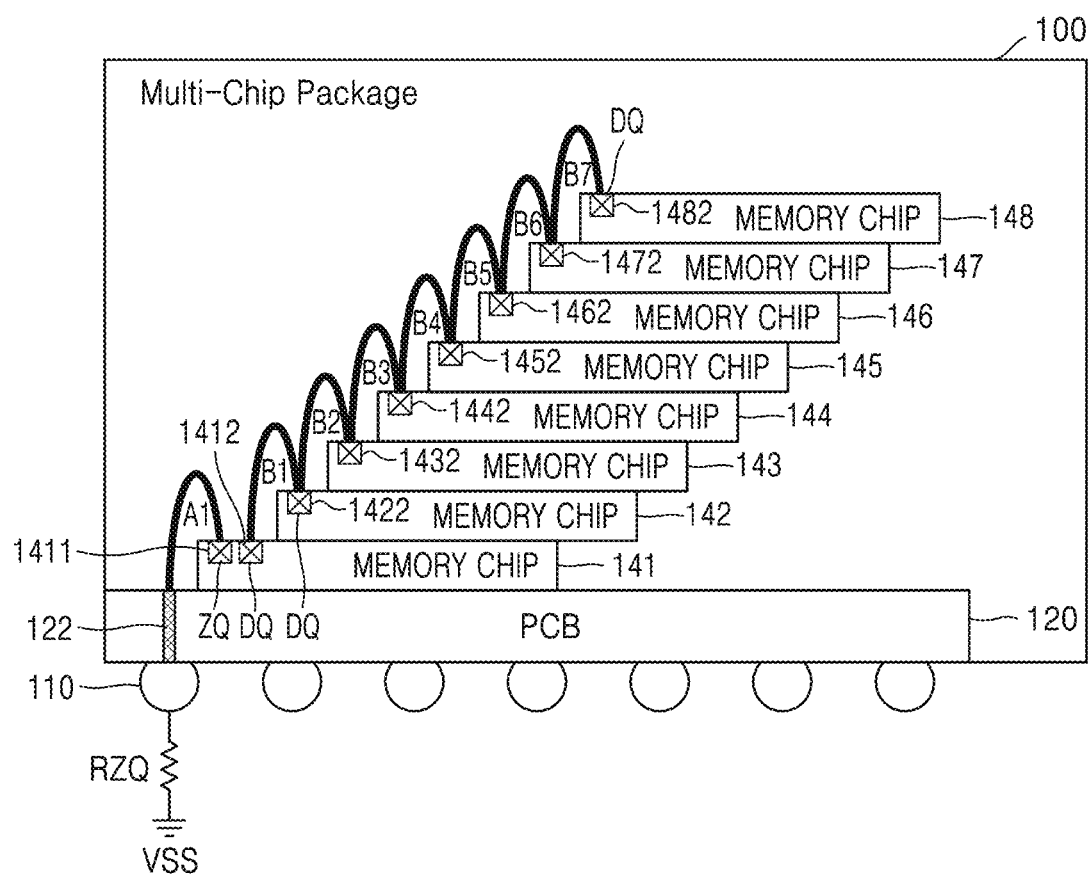
FIG. 1 is a diagram for describing a multi-chip package according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a diagram for describing a multi-chip package 100 according to at least one example embodiment of the inventive concepts.

Referring to FIG. 1, the multi-chip package 100 may include a plurality of memory chips 141 to 148 stacked on a printed circuit board (PCB) 120. The PCB 120 may include a plurality of conductive layers and through-silicon vias (TSVs) 122, which are separated from one another by an insulation layer. The conductive layers and the TSVs 122 of the PCB 120 may be connected to external terminals 110 of the multi-chip package 100. For example, the external terminals 110 of the multi-chip package 100 may be implemented as package balls or package leads.

In some embodiments, the terms "connected" and "coupled" may be described along with a derivative thereof. The terms may not be intended as synonyms. For example, description using the terms "connected" and/or "coupled" may represent that two or more elements contact one another directly and physically or electrically. Also, the term "coupled" may denote that two or more elements do not directly contact one another but still collaborate or cooperate with one another.

The multi-chip package 100 may be implemented as, for example, a package on package (PoP), ball grid arrays (BGA), chip scale package (CSP), plastic leaded chip carrier (PLCC), plastic dual in-line package (PDIP), die in waffle pack, die in wafer form, chip on board (COB), CERamic dual in-line package (CERDIP), metric quad flat package (MQFP), thin quad flat pack (TQFP), small outline (SOIC), shrink small outline package (SSOP), thin small outline (TSOP), system in package (SIP), multi-chip package (MCP), wafer-level fabricated package (WFP), or wafer-level processed stack package (WSP).

The multi-chip package 100 may be a memory system including high-capacity and high-speed memory chips. The memory chips 141 to 148 may each be implemented as non-volatile memory devices. In a non-limiting embodiment, the non-volatile memory devices may include flash memory, phase change random access memory (PRAM), resistance random access memory (RRAM), magnetic random access memory (MRAM), ferroelectric random access memory (FRAM), electrically erasable programmable read-only memory (EEPROM), nano floating gate memory (NFGM), and polymer random access memory (PoRAM). In some embodiments, a multi-chip package 1000 (see FIG. 10) may include solid state drive (SSD), embedded universal flash storage (UFS) memory card, embedded multi-media card (eMMC), compact flash (CF), secure digital (SD), micro secure digital (Micro-SD), mini secure digital (Mini-SD), extreme digital (xD), or memory stick, which includes a buffer chip (or a memory controller) for controlling non-volatile memory chips and volatile memory chips.

According to at least one example embodiment of the inventive concepts, the memory chips 141 to 148 may each be configured to include a plurality of volatile memory devices. In a non-limiting embodiment, the volatile memory devices may include dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, and Rambus dynamic random access memory (RDRAM). In some embodiments, the multi-chip package 100 may be a DRAM multi-chip package (MCP) or a high bandwidth memory (HBM).

According to at least one example embodiment of the inventive concepts, the memory chips 141 to 148 may each be configured with different kinds of memory devices including non-volatile memory devices and volatile memory devices. Hereinafter, an example where each of the memory chips 141 to 148 is a NAND flash memory (e.g., a NAND non-volatile memory device) will be described, but the technical spirit of the present disclosure is not limited thereto.

Each of the memory chips 141 to 148 may be configured with a NAND flash memory. The NAND flash memory may include a memory cell array including memory cells which are arranged in rows (word lines) and columns (bit lines). Each of the memory cells may store 1-bit (single data) data or M-bit (multi-bit) data (where M is an integer of 2 or more). Each memory cell may be implemented as a memory cell, including a charge storage layer such as a charge trap layer or a floating gate, or a memory cell including a variable resistor.

The memory cell array may be implemented to have a single-layer array structure (or a two-dimensional (2D) array structure) or a multi-layer array structure (or a three-dimensional (3D) array structure). A 3D memory array may be a circuit that includes an active area disposed on a silicon substrate and is associated with an operation of each of memory cells, and may be configured in a monolithic type on a physical level of at least one of memory cell arrays each including a circuit which is provided on or in the substrate. The monolithic type may denote that layers of levels configuring the array are stacked just on layers of lower levels of the array.

In an embodiment, the 3D memory array may include a plurality of NAND strings which are arranged in a vertical direction in order for at least one memory cell to be disposed on another memory cell. The at least one memory cell may include a charge trap layer. U.S. Pat. Nos. 7,679,133, 8,553,466, 8,654,587 and 8,559,235 and U.S. Patent Application No. 2011/0233648 disclose appropriate elements of a 3D memory cell array which include a plurality of levels and in which word lines and/or bit lines are shared between the plurality of levels. In the present specification, the reference documents may be incorporated herein by reference. Also, U.S. Patent Application No. 2014-0334232 and U.S. Pat. No. 8,488,381 may be incorporated herein by reference.

According to at least some example embodiments of the inventive concepts, 100 or more stacked word lines may be provided in a vertical NAND channel of the 3D memory array.

In other embodiments, the 3D memory array may have a cell over peri (COP) structure. The COP structure may denote a structure where memory cell structures are stacked on a peripheral circuit, and each of the memory cell structures may include a channel which extends in a direction vertical to an upper surface of a silicon substrate. U.S. Pat. Nos. 9,666,289 and 9,548,316 disclose appropriate elements of the COP structure. In the present specification, the reference documents may be incorporated herein by reference.

The multi-chip package 100 may be equipped in, for example, an SSD. The SSD may include a plurality of independent interfaces which are referred to as channels. A plurality of flash memory devices may be connected to one channel, and the number of flash memory devices connected to one channel may be defined as a way or a bank. The multi-chip package 100 may operate as one channel of the SSD, and each of the plurality of memory chips (for example, first to eighth memory chips) 141 to 148 may be configured with banks.

Each of the memory chips 141 to 148 may be connected to adjacent memory chips through corresponding bonding wires of a plurality of bonding wires B1 to B7. For example, the first memory chip 141 may be connected to the second memory chip 142 through the bonding wire B1. The second memory chip 142 may be connected to the third memory chip 143 through the bonding wire B2. The third memory chip 143 may be connected to the fourth memory chip 144 through the bonding wire B3. The fourth memory chip 144 may be connected to the fifth memory chip 145 through the bonding wire B4. The fifth memory chip 145 may be connected to the sixth memory chip 146 through the bonding wire B5. The sixth memory chip 146 may be connected to the seventh memory chip 147 through the bonding wire B6. The seventh memory chip 147 may be connected to the eighth memory chip 148 through the bonding wire B7. In the present embodiment, it is described that eight memory chips are included in the multi-chip package 100. However, this is merely an embodiment, and the number of memory chips is not limited thereto.

The first to eighth memory chips 141 to 148 may each include a plurality of input/output (I/O) pads. The I/O pads may include data I/O pads (hereinafter referred to as DQ pads), an impedance control pad (hereinafter referred to as a ZQ pad), command pads, and address pads. In FIG. 1, for conciseness of the conceptual description and drawings of the present embodiment, the first to eighth memory chips 141 to 148 may include one DQ pad and may respectively include DQ pads 1412, 1422, 1432, 1442, 1452, 1462, 1472, and 1482, and the DQ pads 1412, 1422, 1432, 1442, 1452, 1462, 1472, and 1482 may be disposed adjacent to one corner of a corresponding memory chip of the first to eighth memory chips 141 to 148 and may be connected to one another by the bonding wires B1 and B2. The first to eighth memory chips 141 to 148 may be stacked as a stair type so that the DQ pads 1412, 1422, 1432, 1442, 1452, 1462, 1472, and 1482 are exposed for bonding wiring.

In regard to the I/O pads, the term "pad" may comprehensively denote an electrical interconnection of an integrated circuit, and for example, may include another electrical contact point of a pin or an integrated circuit.

The first memory chip 141 may be disposed at a lowermost step among the stacked memory chips 141 to 148, connected to the conductive layers and the TSVs 122 of the PCB 120, and coupled to the external terminals 110 of the multi-chip package 100. Therefore, the first memory chip 141 may be referred to as a master chip, and the second to eighth memory chips 142 to 148 other than the first memory chip 141 may be referred to as slave chips.

The first memory chip 141 may include a ZQ pad 1411, and the ZQ pad 1411 may be connected to a corresponding conductive electrode and TSV 122 of the PCB 120 through a bonding wire A1 and may be connected to a corresponding external terminal 110 of the multi-chip package 100. The external terminal 110 connected to the ZQ pad 1411 may be referred to as a ZQ terminal 110. A resistor RZQ may be connected between the ZQ terminal 110 and a ground voltage VSS. A resistance value of the resistor RZQ may be, for example, about 240Ω.

Figure 2:
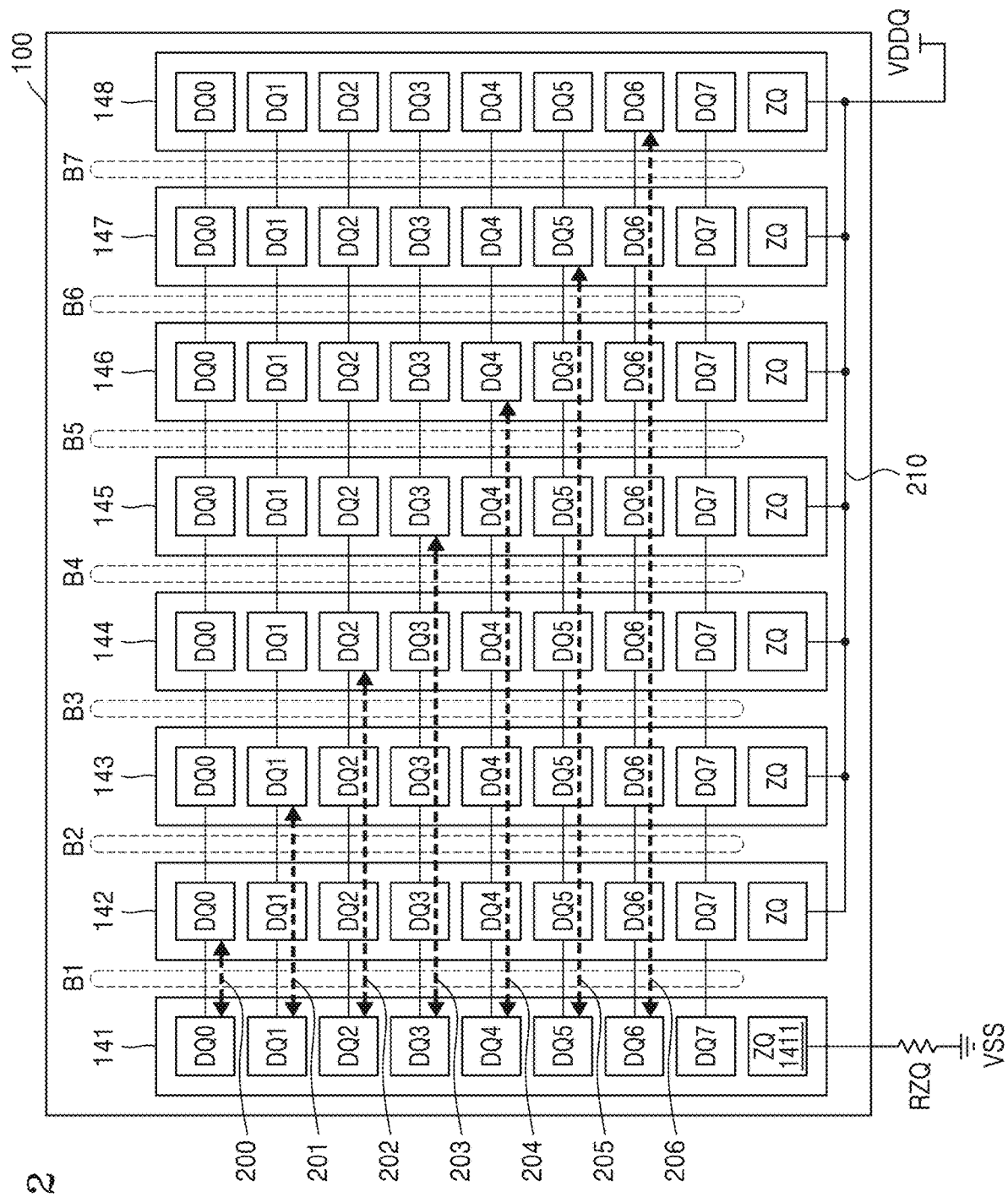
FIG. 2 is a diagram for describing a ZQ calibration method of the multi-chip package of FIG. 1 according to at least one example embodiment of the inventive concepts.

Each of the second to eighth memory chips 142 to 148 may include a ZQ pad. The ZQ pads of the second to eighth memory chips 142 to 148, as illustrated in FIG. 2, may be connected to a source voltage VDDQ via a source voltage line. The source voltage VDDQ may be a source voltage for driving a ZQ engine 310 and a plurality of I/O drivers 320 and 330 (see FIG. 3). I/O drivers 320 and 330 may each be embodied by a circuit or circuitry. I/O drivers 320 and 330 may also be referred to in the present disclosure as DQ drivers 320 and 330.

FIG. 2 is a diagram for describing a ZQ calibration method of the multi-chip package 100 of FIG. 1 according to at least one example embodiment of the inventive concepts.

Referring to FIG. 2, the first to eighth memory chips 141 to 148 of the multi-chip package 100 may include a plurality of DQ pads DQ0 to DQ7 and a ZQ pad. The DQ pads DQ0 to DQ7 of the first to eighth memory chips 141 to 148 may be connected to one another through the bonding wires B1 to B7. For example, the DQ pads DQ0 of the first to eighth memory chips 141 to 148 may be connected to one another, the DQ pads DQ1 may be connected to one another, the DQ pads DQ2 may be connected to one another, the DQ pads DQ3 may be connected to one another, the DQ pads DQ4 may be connected to one another, the DQ pads DQ5 may be connected to one another, the DQ pads DQ6 may be connected to one another, and the DQ pads DQ7 may be connected to one another. The ZQ pad 1411 of the first memory chip 141 may be connected one end of the resistor RZQ, and the other end of the resistor RZQ may be connected to the ground voltage VSS, for example, via a ground voltage line. The ZQ pads of the second to eighth memory chips 142 to 148 may be connected to a signal line (or source voltage line) 210 connected to the source voltage VDDQ.

The first memory chip 141 may control a termination resistance value of each of the DQ pads DQ0 to DQ7 of the first memory chip 141 on the basis of a result of a ZQ calibration operation performed by the ZQ engine 310 connected to the ZQ pad 1411, which is to be described with reference to FIG. 4. The ZQ engine 310 of the first memory chip 141 may perform the ZQ calibration operation by using the resistor RZQ connected to the ZQ pad 1411 to generate pull-up/pull-down calibration codes and may provide the generated pull-up/pull-down calibration codes to the I/O drivers 320 and 330 connected to the DQ pads DQ0 to DQ7 of the first memory chip 141, thereby controlling the termination resistance value of each of the DQ pads DQ0 to DQ7 of the first memory chip 141. Therefore, the DQ pads DQ0 to DQ7 of the first memory chip 141 which is the master chip may be set to have certain termination resistance values.

Each of the second to eighth memory chips 142 to 148 may perform the ZQ calibration operation on the basis of a ZQ calibration option representing a one-to-one correspondence relationship between DQ pads DQ0 to DQ6 of a corresponding memory chip and the DQ pads DQ0 to DQ6 of the first memory chip 141 which is the master chip. Each of the second to eighth memory chips 142 to 148 may perform the ZQ calibration operation coupled to a DQ pad of a corresponding memory chip by using a termination resistance value set to a corresponding DQ pad of the first memory chip 141, thereby controlling termination resistance values of DQ pads DQ0 to DQ6 of a corresponding memory.

In the present embodiment, the multi-chip package may include the eight memory chips 141 to 148 which are stacked, and each of the memory chips 141 to 148 may include eight DQ pads. The number of DQ pads for performing the ZQ calibration operation at a time between the first memory chip 141 which is the master chip and the second to eighth memory chips 142 to 148 which are the slave chips may be determined to be seven. According to at least one example embodiment of the inventive concepts, the multi-chip package 100 may include odd-numbered memory chips which are stacked, and each of the odd-numbered memory chips may include odd-numbered DQ pads.

A ZQ calibration operation 200 may be performed between the DQ pad DQ0 of the first memory chip 141 and the DQ pad DQ0 of the second memory chip 142, and thus, termination resistance values of the DQ pads DQ0 to DQ6 of the second memory 142 may be controlled. For example, the ZQ calibration operation 200 of the DQ pad DQ0 of the second memory chip 142 may be performed by using a termination resistance value set to the DQ pad DQ0 of the first memory chip 141, which is to be described with reference to FIG. 5. The second memory chip 142 may generate pull-up/pull-down calibration codes as a result of the ZQ calibration operation 200 and may provide the generated pull-up/pull-down calibration codes to the I/O drivers 320 and 330 connected to the DQ pads DQ0 to DQ6 of the second memory chip 142, thereby controlling termination resistance values (e.g., pull-up and/or pull-down termination resistance values) of the DQ pads DQ0 to DQ6 of the second memory chip 142.

A ZQ calibration operation 201 may be performed between the DQ pad DQ1 of the first memory chip 141 and the DQ pad DQ1 of the third memory chip 143, and thus, termination resistance values of the DQ pads DQ0 to DQ6 of the third memory 143 may be controlled. A ZQ calibration operation 202 may be performed between the DQ pad DQ2 of the first memory chip 141 and the DQ pad DQ2 of the fourth memory chip 144, and thus, termination resistance values of the DQ pads DQ0 to DQ6 of the fourth memory 144 may be controlled. A ZQ calibration operation 203 may be performed between the DQ pad DQ3 of the first memory chip 141 and the DQ pad DQ3 of the fifth memory chip 145, and thus, termination resistance values of the DQ pads DQ0 to DQ6 of the fifth memory 145 may be controlled. A ZQ calibration operation 204 may be performed between the DQ pad DQ4 of the first memory chip 141 and the DQ pad DQ4 of the sixth memory chip 146, and thus, termination resistance values of the DQ pads DQ0 to DQ6 of the sixth memory 146 may be controlled. A ZQ calibration operation 205 may be performed between the DQ pad DQ5 of the first memory chip 141 and the DQ pad DQ5 of the seventh memory chip 147, and thus, termination resistance values of the DQ pads DQ0 to DQ6 of the seventh memory 147 may be controlled.

A ZQ calibration operation 206 may be performed between the DQ pad DQ6 of the first memory chip 141 and the DQ pad DQ6 of the eighth memory chip 148, and thus, termination resistance values of the DQ pads DQ0 to DQ6 of the eighth memory 148 may be controlled. For example, the ZQ calibration operation 206 of the DQ pad DQ6 of the eighth memory chip 148 may be performed by using a termination resistance value set to the DQ pad DQ6 of the first memory chip 141, which is to be described with reference to FIG. 6. The eighth memory chip 148 may generate pull-up/pull-down calibration codes as a result of the ZQ calibration operation 206 and may provide the generated pull-up/pull-down calibration codes to the I/O drivers 320 and 330 connected to the DQ pads DQ0 to DQ6 of the eighth memory chip 148, thereby controlling termination resistance values (e.g., pull-up and/or pull-down termination resistance values) of the DQ pads DQ0 to DQ6 of the eighth memory chip 148.

In the present embodiment, it is described that the number of stacked memory chips 141 to 148 of the multi-chip package 100 is eight and the number of DQ pads DQ0 to DQ6 of the memory chips 141 to 148 is seven. When the number of stacked memory chips of the multi-chip package 100 is set to 2n (where n is an integer of 1 or more) or more, a ZQ calibration operation may be performed on m (where m is an integer equal to or less than $2n-1$ ($m \leq 2n-1$)) number of DQ pads of the memory chips.

According to at least one example embodiment of the inventive concepts, when n (where n is an integer of 1 or more) number of memory chips including m (where m is an integer of 1 or more) number of DQ pads are stacked in a multi-chip package, the number of stacked memory chips for performing a ZQ calibration operation using DQ pads at a time between a master chip and slave chips may be determined to be $n \leq m+1$.

According to at least one example embodiment of the inventive concepts, when n ($n > m+1$) number of memory chips including m (where m is an integer of 1 or more) number of DQ pads are stacked in a multi-chip package, a ZQ calibration operation may be performed in the multi-chip package "i" ($i = [(n-1)/m]+1$) times.

Figure 3:
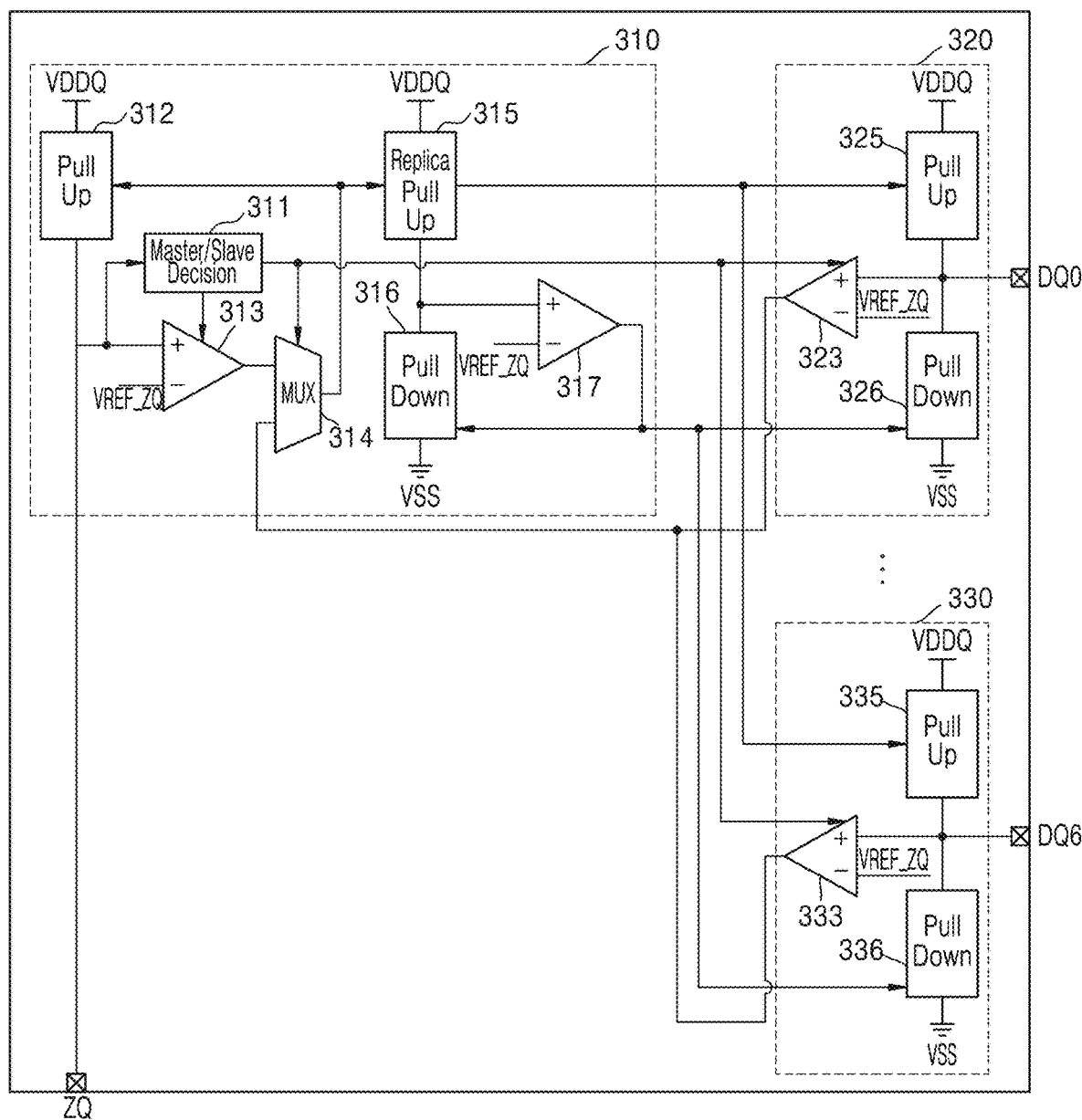
FIG. 3 is a block diagram for describing memory chips of FIG. 2 according to at least one example embodiment of the inventive concepts.

FIG. 3 is a block diagram for describing the memory chips 141 to 148 of FIG. 2 according to at least one example embodiment of the inventive concepts.

Referring to FIG. 3, each of the memory chips 141 to 148 may include a ZQ engine 310 connected to a ZQ pad and a plurality of I/O drivers 320 and 330 connected to DQ pads DQ0 to DQ6. For conciseness of the drawing, the I/O driver 320 connected to the DQ pad DQ0 of the DQ pads DQ0 to DQ6 and the I/O driver 330 connected to the DQ pad DQ6 are illustrated. The same I/O drivers as the I/O drivers 320 and 330 may be connected to the DQ pads DQ1 to DQ5. Each of the I/O drivers 320 and 330 may include a plurality of comparators 323 and 333, a plurality of pull-up units 325 and 335, and a plurality of pull-down units 326 and 336.

The ZQ engine 310 may perform a ZQ calibration operation of a corresponding memory chip. The ZQ calibration operation may include a pull-up calibration operation and a pull-down calibration operation. The ZQ engine 310 may include a master/slave determiner 311, a first pull-up unit 312, a first comparator 313, a multiplexer 314, a second pull-up unit 315, a pull-down unit 316, and a second comparator 317.

The master/slave determiner 311 may be connected to a ZQ pad. The master/slave determiner 311 may be a circuit or circuitry configured to detect a voltage level of a ZQ pad of a corresponding memory chip and to determine whether the corresponding memory chip is a master chip or a slave chip based on the detected voltage level. The master/slave determiner 311 may also be referred to in the present disclosure as master/slave circuit 311 or master/slave circuitry 311. When a voltage level of the ZQ pad is a VDDQ voltage level (e.g., a source voltage level), the master/slave determiner 311 may determine the corresponding memory chip as the slave chip. When the voltage level of the ZQ pad is not the VDDQ voltage level (e.g., the source voltage level), the master/slave determiner 311 may determine the corresponding memory chip as the master chip. The master/slave determiner 311 may store a ZQ calibration option representing each of one-to-one correspondence relationships 200 to 206 performing a ZQ calibration operation between DQ pads DQ0 to DQ6 of the master chip and the DQ pads DQ0 to DQ6 of the slave chips.

When it is determined by the master/slave determiner 311 that the corresponding memory chip is the master chip, the first comparator 313 may be or include a circuit or circuitry configured to compare a voltage of the ZQ pad with a reference voltage VREF_ZQ. The reference voltage VREF_ZQ may have a voltage level corresponding to half (VDDQ/2) of the VDDQ voltage level (e.g., the source voltage level).

An output of the first comparator 313 may be provided as a first input of the multiplexer 314. An output of each of the comparators 323 and 333 of the I/O drivers 320 and 330 may be provided as a second input of the multiplexer 314. The comparators 323 and 33 may each be embodied by a circuit or circuitry. When it is determined by the master/slave determiner 311 that the corresponding memory chip is the master chip, the multiplexer 314 may output the output of the first comparator 313 input as the first input thereof, and when it is determined by the master/slave determiner 311 that the corresponding memory chip is the slave chip, the multiplexer 314 may output the output of each of the comparators 323 and 333 of the I/O drivers 320 and 330 input as the second input thereof.

The first pull-up unit 312 may be or include a circuit or circuitry configured to perform a pull-up calibration operation on the basis of the output of the first comparator 313. The first pull-up unit 312 may generate a pull-up calibration code on the basis of the output of the first comparator 313, and in this case, the pull-up calibration operation may be performed by varying the pull-up calibration code until a voltage of the ZQ pad is equal to the reference voltage VREF_ZQ. The first pull-up unit 312 may provide the second pull-up unit 315 and the pull-up units 325 and 335 of the I/O drivers 320 and 330 with the pull-up calibration code at a time when the voltage of the ZQ pad is equal to the reference voltage VREF_ZQ. The pull-up units 325 and 335 may each be embodied by a circuit or circuitry.

The second pull-up unit 315 may be or include a circuit or circuitry that has substantially the same configuration as that of the first pull-up unit 312. An impedance of the second pull-up unit 315 may be controlled based on the pull-up calibration code. Therefore, the impedance of the second pull-up unit 315 may be substantially the same as that of the first pull-up unit 312.

The second comparator 317 may be or include a circuit or circuitry configured to compare the reference voltage VREF_ZQ with a voltage of a connection node between the second pull-up unit 315 and the pull-down unit 316.

The pull-down unit 316 may be or include a circuit or circuitry configured to perform a pull-down calibration operation on the basis of the output of the second comparator 317. The pull-down unit 316 may generate a pull-down calibration code on the basis of an output of the second comparator 317, and in this case, a pull-down calibration operation may be performed by varying the pull-down calibration code until the voltage of the connection node between the second pull-up unit 315 and the pull-down unit 316 is equal to the reference voltage VREF_ZQ. The pull-down unit 316 may provide the pull-down units 326 and 336 of the I/O drivers 320 and 330 with the pull-down calibration code at a time when the voltage of the connection node between the second pull-up unit 315 and the pull-down unit 316 is equal to the reference voltage VREF_ZQ. The pull-down units 326 and 336 may each be embodied by a circuit or circuitry.

The pull-up/pull-down calibration codes generated by the ZQ engine 310 may be provided to the I/O drivers 320 and 330 connected to the DQ pads DQ0 to DQ6, and thus, termination resistance values (e.g., pull-up and/or pull-down termination resistance values) of the DQ pads DQ0 to DQ6 may be controlled.

Figure 4:
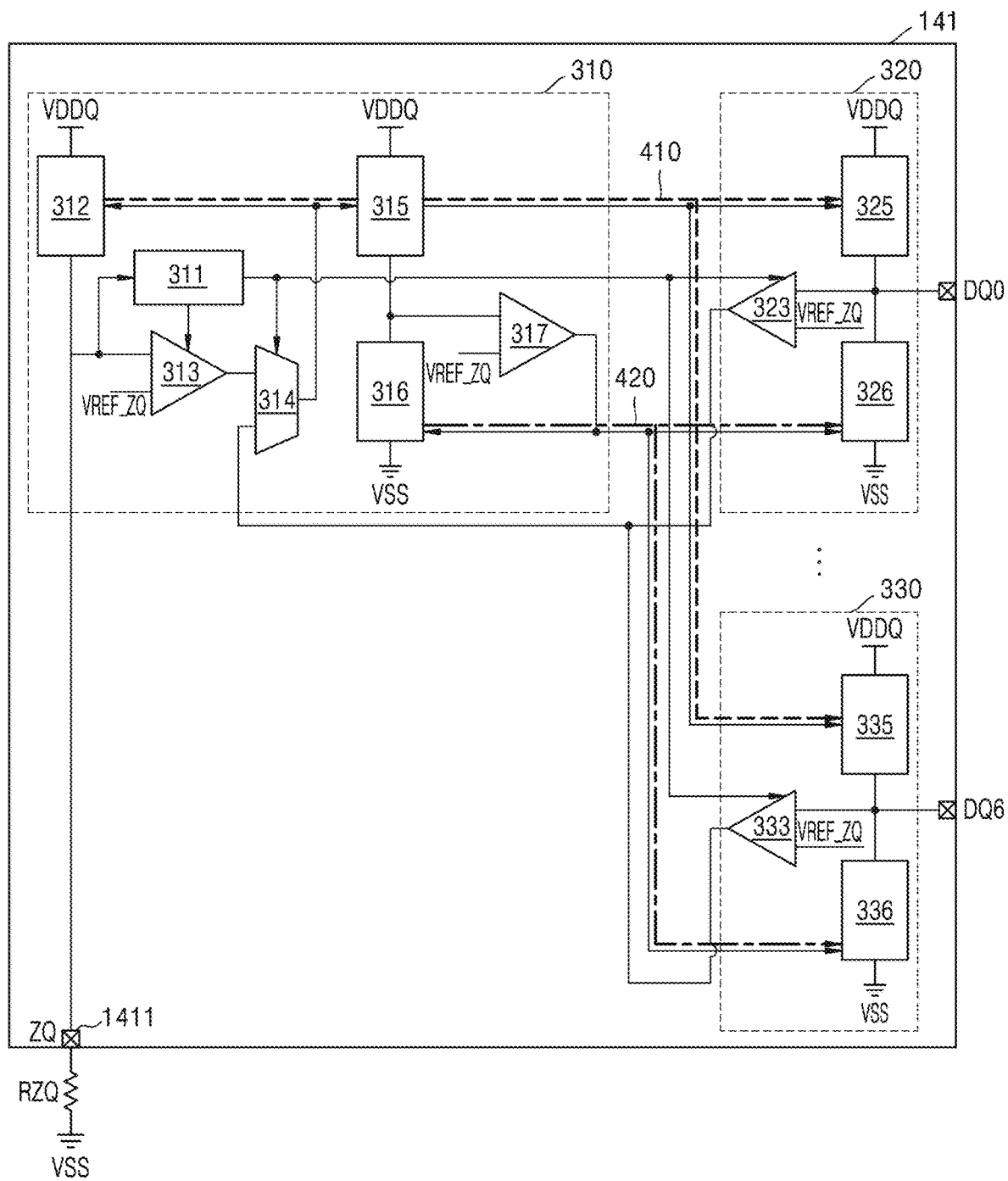
FIG. 4 is a diagram for describing a ZQ calibration operation performed by a master chip according to at least one example embodiment of the inventive concepts.

FIG. 4 is a diagram for describing a ZQ calibration operation performed by a master chip according to at least one example embodiment of the inventive concepts.

Referring to FIGS. 2 and 4, a ZQ calibration operation of a first memory chip 141 which is a master chip will be described. A ZQ pad 1411 of the first memory chip 141 may be connected to a resistor RZQ. A master/slave determiner 311 may detect that a voltage level of the ZQ pad 1411 is not a VDDQ voltage level (e.g., a source voltage level), and thus, may determine the first memory chip 141 as the master chip.

A first comparator 313 may compare a voltage of the ZQ pad 1411 with a reference voltage VREF_ZQ and may provide a comparison result to a first pull-up unit 312 through a multiplexer 314. The first pull-up unit 312 may perform a pull-up calibration operation on the basis of an output of a first comparator 313 and may provide a second pull-up unit 315 and pull-up units 325 and 335 of I/O drivers 320 and 330 with a pull-up calibration code at a time when the voltage of the ZQ pad 1411 is equal to the reference voltage VREF_ZQ (410).

An impedance of the second pull-up unit 315 may be controlled based on the pull-up calibration code. A second comparator 317 may compare a level of the reference voltage VREF_ZQ with a level of a voltage of a connection node between the second pull-up unit 315 and a pull-down unit 316. The pull-down unit 316 may perform a pull-down calibration operation on the basis of an output of a second comparator 317 and may provide pull-down units 326 and 336 of the I/O drivers 320 and 330 with a pull-down calibration code at a time when the voltage of the connection node between the second pull-up unit 315 and the pull-down unit 316 is equal to the reference voltage VREF_ZQ (420).

A ZQ engine 310 may perform a ZQ calibration operation by using the resistor RZQ connected to the ZQ pad 1411. The ZQ engine 310 may be configured so that pull-up calibration codes generated as a result of the ZQ calibration operation are simultaneously provided to the pull-up units 325 and 335 of the I/O drivers 320 and 330 connected to the DQ pads DQ0 to DQ6 (420), and moreover, may be configured so that pull-down calibration codes are simultaneously provided to the pull-down units 326 and 336 of the I/O drivers 320 and 330 connected to the DQ pads DQ0 to DQ6 (420). Therefore, the DQ pads DQ0 to DQ6 of the first memory chip 141 which is the master chip may be set to have certain termination resistance values.

Figure 5:
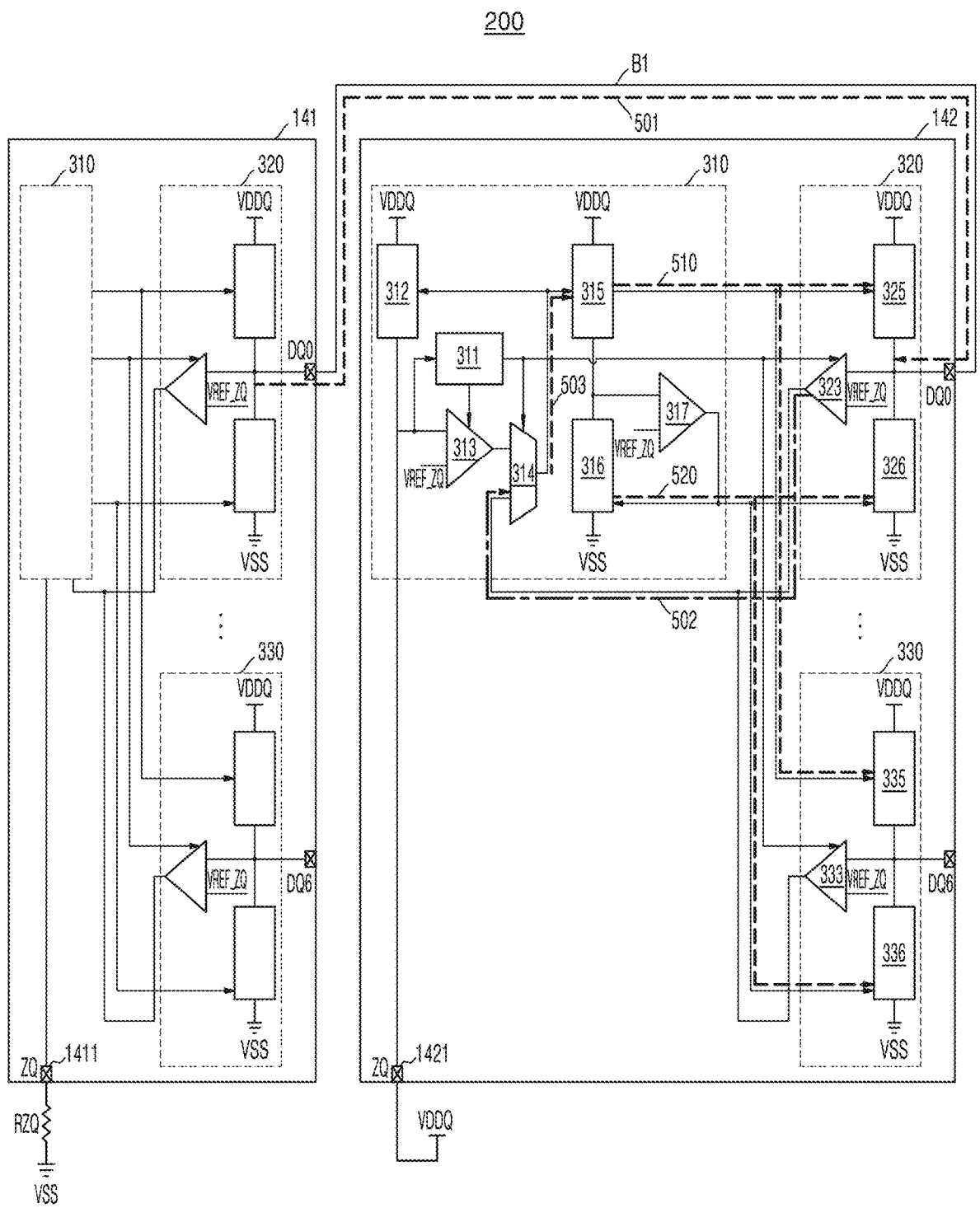
FIG. 5 is a diagram for describing a ZQ calibration operation performed by a slave chip according to at least one example embodiment of the inventive concepts.

FIG. 5 is a diagram for describing a ZQ calibration operation performed by a slave chip according to at least one example embodiment of the inventive concepts.

Referring to FIGS. 2 and 5, a ZQ calibration operation 200 performed between a DQ pad DQ0 of a first memory chip 141 which is a master chip and a DQ pad DQ0 of a second memory chip 142 which is a slave chip will be described, and for example, the ZQ calibration operation 200 performed by the second memory chip 142 will be described.

The DQ pad DQ0 of the first memory chip 141 may be connected to the DQ pad DQ0 of the second memory chip 142 through a bonding wire B1. Also, a ZQ pad 1421 of the second memory chip 142 may be connected to a VDDQ voltage line. A master/slave determiner 311 may detect that a voltage level of the ZQ pad 1421 is a VDDQ voltage level (e.g., a source voltage level), and thus, may determine the second memory chip 142 as the slave chip.

When it is determined by the master/slave determiner 311 that the second memory chip 142 is the slave chip, an output of a comparator 323 of an I/O driver 320 connected to a DQ pad DQ0 of the second memory chip 142 may be provided to a multiplexer 314 (502). The comparator 323 may compare a level of a reference voltage VREF_ZQ with a voltage level of the DQ pad DQ0 of the second memory chip 142. An output of the comparator 323 may be provided to a second pull-up unit 315 through the multiplexer 314 (503). A pull-up calibration operation may be performed in the first pull-up unit 312 and the second pull-up unit 315 on the basis of the output of the comparator 323, and a pull-up calibration code generated as a result of the pull-up calibration operation may be provided to pull-up units 325 and 335 of I/O drivers 320 and 330 (510).

An impedance of the second pull-up unit 315 may be controlled based on the pull-up calibration code, and a second comparator 317 may compare a level of the reference voltage VREF_ZQ with a voltage level of a connection node between the second pull-up unit 315 and a pull-down unit 316. The pull-down unit 316 may perform a pull-down calibration operation on the basis of an output of a second comparator 317 and may provide pull-down units 326 and 336 of the I/O drivers 320 and 330 with a pull-down calibration code at a time when a voltage of the connection node between the second pull-up unit 315 and the pull-down unit 316 is equal to the reference voltage VREF_ZQ (520).

A ZQ engine 310 may perform a ZQ calibration operation coupled to the DQ pad DQ0 of the second memory chip 142 by using a termination resistance value set to the DQ pad DQ0 of the first memory chip 141. The ZQ engine 310 may be configured so that pull-up calibration codes generated as a result of the ZQ calibration operation are simultaneously provided to the pull-up units 325 and 335 of the I/O drivers 320 and 330 connected to DQ pads DQ0 to DQ6 (510), and moreover, may be configured so that pull-down calibration codes are simultaneously provided to the pull-down units 326 and 336 of the I/O drivers 320 and 330 connected to DQ pads DQ0 to DQ6 (520). Therefore, the DQ pads DQ0 to DQ6 of the second memory chip 142 which is the slave chip may be set to have certain termination resistance values.

Figure 6:
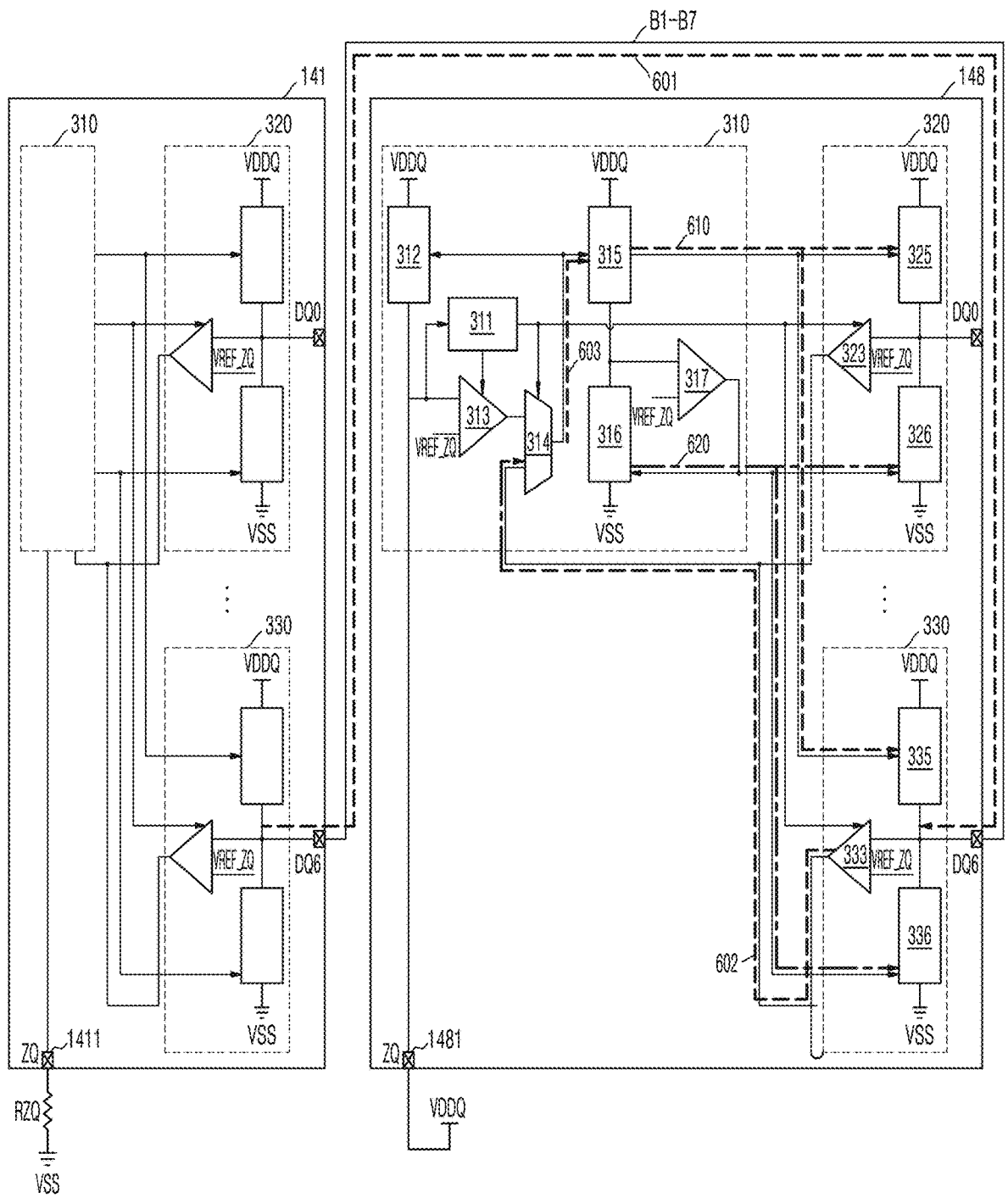
FIG. 6 is a diagram for describing a ZQ calibration operation performed by a slave chip according to at least one example embodiment of the inventive concepts.

FIG. 6 is a diagram for describing a ZQ calibration operation performed by a slave chip according to at least one example embodiment of the inventive concepts.

Referring to FIGS. 2 and 6, a ZQ calibration operation 207 performed between a DQ pad DQ6 of a first memory chip 141 which is a master chip and a DQ pad DQ6 of an eighth memory chip 148 which is a slave chip will be described, and for example, the ZQ calibration operation 207 performed by the eighth memory chip 148 will be described.

The DQ pad DQ6 of the first memory chip 141 may be connected to the DQ pad DQ6 of the eighth memory chip 148 through bonding wires B1 to B7. Also, a ZQ pad 1481 of the eighth memory chip 148 may be connected to a VDDQ voltage line. A master/slave determiner 311 may detect that a voltage level of a ZQ pad 1481 is a VDDQ voltage level (e.g., a source voltage level), and thus, may determine the eighth memory chip 148 as the slave chip.

When it is determined by a master/slave determiner 311 that the eighth memory chip 148 is the slave chip, an output of a comparator 323 of an I/O driver 320 connected to a DQ pad DQ8 of the eighth memory chip 148 may be provided to a multiplexer 314 (602). The comparator 323 may compare a level of a reference voltage VREF_ZQ with a voltage level of the DQ pad DQ6 of the eighth memory chip 148. An output of the comparator 323 may be provided to a second pull-up unit 315 through the multiplexer 314 (603). A pull-up calibration operation may be performed in the first pull-up unit 312 and the second pull-up unit 315 on the basis of the output of the comparator 323, and a pull-up calibration code generated as a result of the pull-up calibration operation may be provided to pull-up units 325 and 335 of I/O drivers 320 and 330 (610).

An impedance of the second pull-up unit 315 may be controlled based on the pull-up calibration code, and a second comparator 317 may compare a level of the reference voltage VREF_ZQ with a voltage level of a connection node between the second pull-up unit 315 and a pull-down unit 316. The pull-down unit 316 may perform a pull-down calibration operation on the basis of an output of the second comparator 317 and may provide pull-down units 326 and 336 of the I/O drivers 320 and 330 with a pull-down calibration code at a time when a voltage of the connection node between the second pull-up unit 315 and the pull-down unit 316 is equal to the reference voltage VREF_ZQ (620).

A ZQ engine 310 may perform a ZQ calibration operation coupled to the DQ pad DQ6 of the eighth memory chip 148 by using a termination resistance value set to the DQ pad DQ6 of the first memory chip 141. The ZQ engine 310 may be configured so that pull-up calibration codes generated as a result of the ZQ calibration operation are simultaneously provided to the pull-up units 325 and 335 of the I/O drivers 320 and 330 connected to DQ pads DQ0 to DQ6 (610), and moreover, may be configured so that pull-down calibration codes are simultaneously provided to the pull-down units 326 and 336 of the I/O drivers 320 and 330 connected to DQ pads DQ0 to DQ6 (620). Therefore, the DQ pads DQ0 to DQ6 of the eighth memory chip 148 which is the slave chip may be set to have certain termination resistance values.

Figure 7:
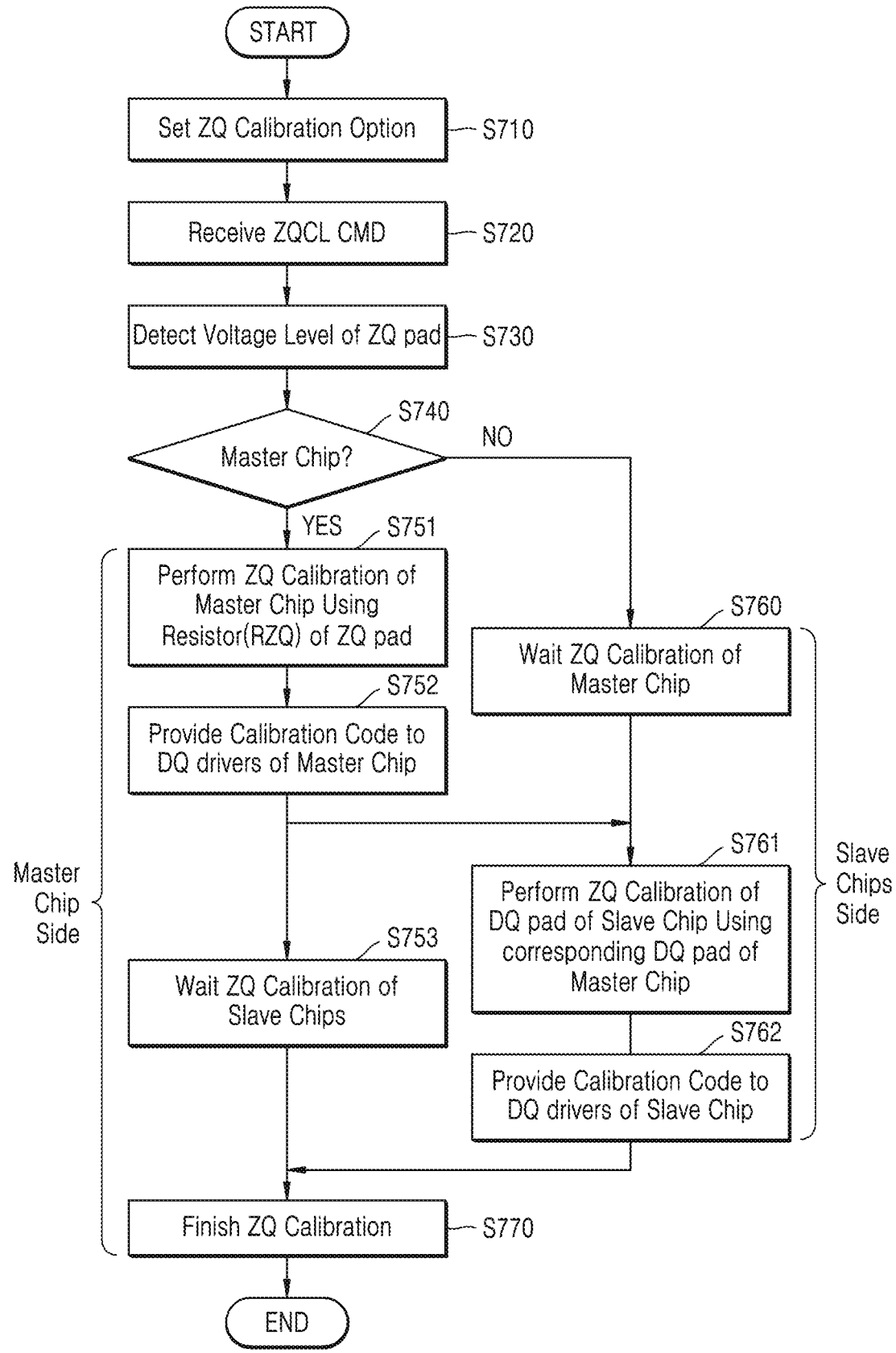
FIG. 7 is a diagram for describing a ZQ calibration method of a multi-chip package according to at least one example embodiment of the inventive concepts.

FIG. 7 is a diagram for describing a ZQ calibration method of a multi-chip package according to at least one example embodiment of the inventive concepts.

Referring to FIGS. 1, 2, 3, and 7, a ZQ calibration option of a multi-chip package 100 may be set in operation S710. The ZQ calibration option may include the one-to-one correspondence relationships 200 to 206 performing the ZQ calibration operation between the DQ pads DQ0 to DQ6 of the master chip and the DQ pads DQ0 to DQ6 of the slave chips. The ZQ calibration option may be set in a register of the first memory chip 141 which operates as the master chip. Alternatively, the ZQ calibration option may be set in a register of each of the first to eighth memory chips 141 to 148. Alternatively, the ZQ calibration option may be set in the master/slave determiner 311 of each of the first to eighth memory chips 141 to 148.

For example, the ZQ calibration option may be configured so that the ZQ calibration operation 200 is performed between the DQ pad DQ0 of the first memory chip 141 and the DQ pad DQ0 of the second memory chip 142. Also, the ZQ calibration option may be configured so that the ZQ calibration operation 201 is performed between the DQ pad DQ1 of the first memory chip 141 and the DQ pad DQ1 of the third memory chip 143, the ZQ calibration operation 202 is performed between the DQ pad DQ2 of the first memory chip 141 and the DQ pad DQ2 of the fourth memory chip 144, the ZQ calibration operation 203 is performed between the DQ pad DQ3 of the first memory chip 141 and the DQ pad DQ3 of the fifth memory chip 145, the ZQ calibration operation 204 is performed between the DQ pad DQ4 of the first memory chip 141 and the DQ pad DQ4 of the sixth memory chip 146, the ZQ calibration operation 205 is performed between the DQ pad DQ5 of the first memory chip 141 and the DQ pad DQ5 of the seventh memory chip 147, and the ZQ calibration operation 206 is performed between the DQ pad DQ6 of the first memory chip 141 and the DQ pad DQ6 of the eighth memory chip 148.

A ZQ calibration command ZQCL may be received through the terminals 110 of the multi-chip package 100 in operation 720. The ZQ calibration command ZQCL may be provided by a memory controller of an electronic device including the multi-chip package 100. The electronic device may include, for example, a computing system, a server, a server array or a server farm, a web server, a network server, an Internet server, a workstation, a mini computer, a main frame computer, a web tool, or a combination thereof.

The multi-chip package 100 may detect a voltage level of each of ZQ pads by using the master/slave determiner 311 of each of the first to eighth memory chips 141 to 148 in response to the ZQ calibration command ZQCL in operation S730.

When a voltage level of a ZQ pad of a corresponding memory chip is the VDDQ voltage level (e.g., the source voltage level), the master/slave determiner 311 of each of the first to eighth memory chips 141 to 148 may determine the corresponding memory chip as the slave chip in operation S740, and operation S760 may be performed.

When the voltage level of the ZQ pad of the corresponding memory chip is not the VDDQ voltage level, the master/slave determiner 311 of each of the first to eighth memory chips 141 to 148 may determine the corresponding memory chip as the master chip in operation S740, and operation S751 may be performed.

When the corresponding memory chip (for example, the first memory chip 141) is the master chip in operation S740, the ZQ engine 310 of the first memory chip 141 may perform a ZQ calibration operation by using the resistor RZQ connected to the ZQ pad 1411 in operation S751. The ZQ engine 310 of the first memory chip 141 may perform a pull-up calibration operation of generating a pull-up calibration code on the basis of a result obtained by comparing a voltage of the ZQ pad 1411 with the reference voltage VREF_ZQ and may perform a pull-down calibration operation of generating a pull-down calibration code on the basis of a result obtained by comparing the level of the reference voltage VREF_ZQ with a voltage level of a connection node between the second pull-up unit 315 and the pull-down unit 316 controlled based on the pull-up calibration code.

The ZQ engine 310 of the first memory chip 141 which is the master chip may provide pull-up/pull-down calibration codes, generated as a result of the ZQ calibration operation (S750), to the I/O drivers 320 and 330 connected to the DQ pads DQ0 to DQ6 of the first memory chip 141 in operation S752. Therefore, the DQ pads DQ0 to DQ6 of the first memory chip 141 which is the master chip may be set to have certain termination resistance values.

Subsequently, the first memory chip 141 which is the master chip may end the ZQ calibration operation and may wait for until ZQ calibration operations of the slave chips end in operation S753.

When the corresponding memory chip (for example, the second memory chip 142) is the slave chip in operation S740, the second memory chip 142 which is the slave chip may wait for until the ZQ calibration operation of the first memory chip 141 which is the master chip ends in operation S760.

When the ZQ calibration operation of the first memory chip 141 which is the master chip ends in operation S751, the ZQ engine 310 of the second memory chip 142 which is the slave chip may perform a ZQ calibration operation coupled to the DQ pad of the second memory chip 142 by using a termination resistance value set to the DQ pad of the first memory chip 141 which is the master chip in operation S761. The ZQ engine 310 of the second memory chip 142 may perform a pull-up calibration operation of generating a pull-up calibration code on the basis of a result obtained by comparing the reference voltage VREF_ZQ with a voltage of the DQ pad DQ0 of the second memory chip 142 connected to the DQ pad DQ0 of the first memory chip 141 and may perform a pull-down calibration operation of generating a pull-down calibration code on the basis of a result obtained by comparing the level of the reference voltage VREF_ZQ with a voltage level of a connection node between the second pull-up unit 315 and the pull-down unit 316 controlled based on the pull-up calibration code.

The ZQ engine 310 of the second memory chip 142 which is the slave chip may provide pull-up/pull-down calibration codes, generated as a result of the ZQ calibration operation (S750), to the I/O drivers 320 and 330 connected to the DQ pads DQ0 to DQ6 of the second memory chip 142 in operation S762. Therefore, the DQ pads DQ0 to DQ6 of the second memory chip 142 which is the slave chip may be set to have certain termination resistance values.

Operations S760, S761, and S762 described on the second memory chip 142 which is the slave chip may be identically and simultaneously applied to the third to eighth memory chips 143 to 148 which are the slave chips. That is, each of the second to eighth memory chips 142 to 148 which are the slave chips may wait for until the ZQ calibration operation of the first memory chip 141 which is the master chip ends in operation S760. Each of the second to eighth memory chips 142 to 148 may perform the ZQ calibration operation by using a termination resistance value set to each of the DQ pads DQ0 to DQ6 of the first memory chip 141 on the basis of one-to-one correspondence relationships between DQ pads DQ0 to DQ6 of the corresponding memory chip and the DQ pads DQ0 to DQ6 of the first memory chip 141 which is the master chip in operation S761. Each of the second to eighth memory chips 142 to 148 may perform a ZQ calibration operation coupled to the DQ pad of the corresponding memory chip by using a termination resistance value set to a corresponding DQ pad of the first memory chip 141 to control termination resistance values of the DQ pads DQ0 to DQ6 of the corresponding memory chip in operation S762.

Figure 8:
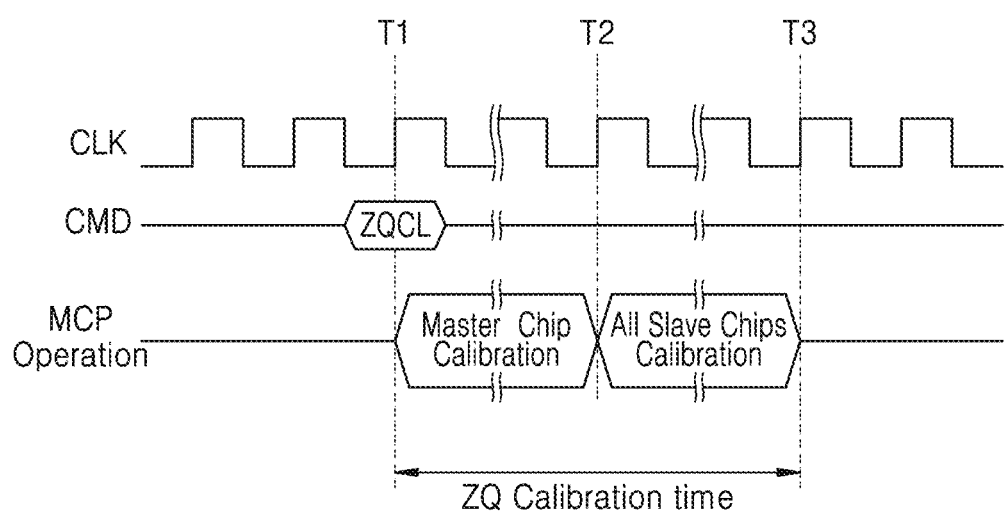
FIG. 8 is an operation timing diagram based on the ZQ calibration method of the multi-chip package of FIG. 7 according to at least one example embodiment of the inventive concepts.

FIG. 8 is an operation timing diagram based on the ZQ calibration method of the multi-chip package 100 of FIG. 7 according to at least one example embodiment of the inventive concepts. FIG. 8 shows a timing diagram of an operation of the multi-chip package 100 which is performed based on a clock signal CLK according to communication protocols or specifications. It should be construed that timing diagrams described herein are not illustrated at a certain ratio.

Referring to FIG. 8, at a time T1, a ZQ calibration command ZQCL may be received by the multi-chip package 100. In response to the ZQ calibration command ZQCL, the first memory chip 141 acting as a master chip of the multi-chip package 100 may perform a ZQ calibration operation by using the resistor RZQ connected to the ZQ pad 1411. As a result of the ZQ calibration operation of the first memory chip 141, the DQ pads DQ0 to DQ6 of the first memory chip 141 may be set to have certain termination resistance values.

At a time T2, when the ZQ calibration operation of the first memory chip 141 which is the master chip ends, each of the second to eighth memory chips 142 to 148 which are the slave chips may perform a ZQ calibration operation coupled to a DQ pad of a corresponding memory chip by using a termination resistance value set to a corresponding DQ pad of the first memory chip 141 which is the master chip. As a result of the ZQ calibration operation of each of the second to eighth memory chips 142 to 148, the DQ pads DQ0 to DQ6 of each of the second to eighth memory chips 142 to 148 may be set to have certain termination resistance values.

During an interval between the time T2 and a time T3, the ZQ calibration operations of the second to eighth memory chips 142 to 148 which are the slave memory chips may end. The interval between the time T2 and the time T3 may represent a time taken until second ZQ calibration operations of all slave memory chips end. The interval between the time T2 and the time T3 may be longer than a time taken until the second ZQ calibration operation of one slave memory chip is completed. For example, the interval between the time T2 and the time T3 may be shorter than a time which is two times a time taken until the second ZQ calibration operation of one slave memory chip is completed.

As described above, the first memory chip 141 corresponding to the master chip among the plurality of memory chips 141 to 148 may perform a one-time ZQ calibration operation, and then, the second to eighth memory chips 142 to 148 which are the other slave chips may simultaneously perform a one-time ZQ calibration operation, thereby completing the ZQ calibration operation of the multi-chip package 100. That is, the ZQ calibration operation of the multi-chip package 100 may be completed by performing the ZQ calibration operation twice, and thus, it may be seen that a ZQ calibration time is considerably reduced compared to the related art where the ZQ calibration operation is performed eight times as described below with reference to FIGS. 9A and 9B.

Figure 9A:
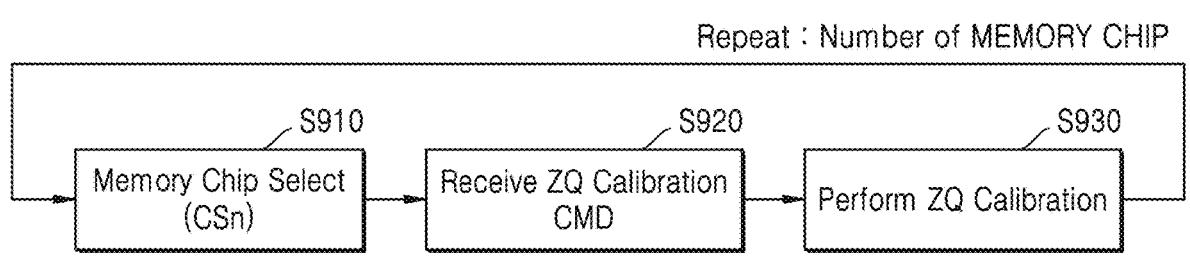
FIGS. 9A and 9B are diagrams for describing a ZQ calibration method of a multi-chip package of the related art.
Figure 9B:
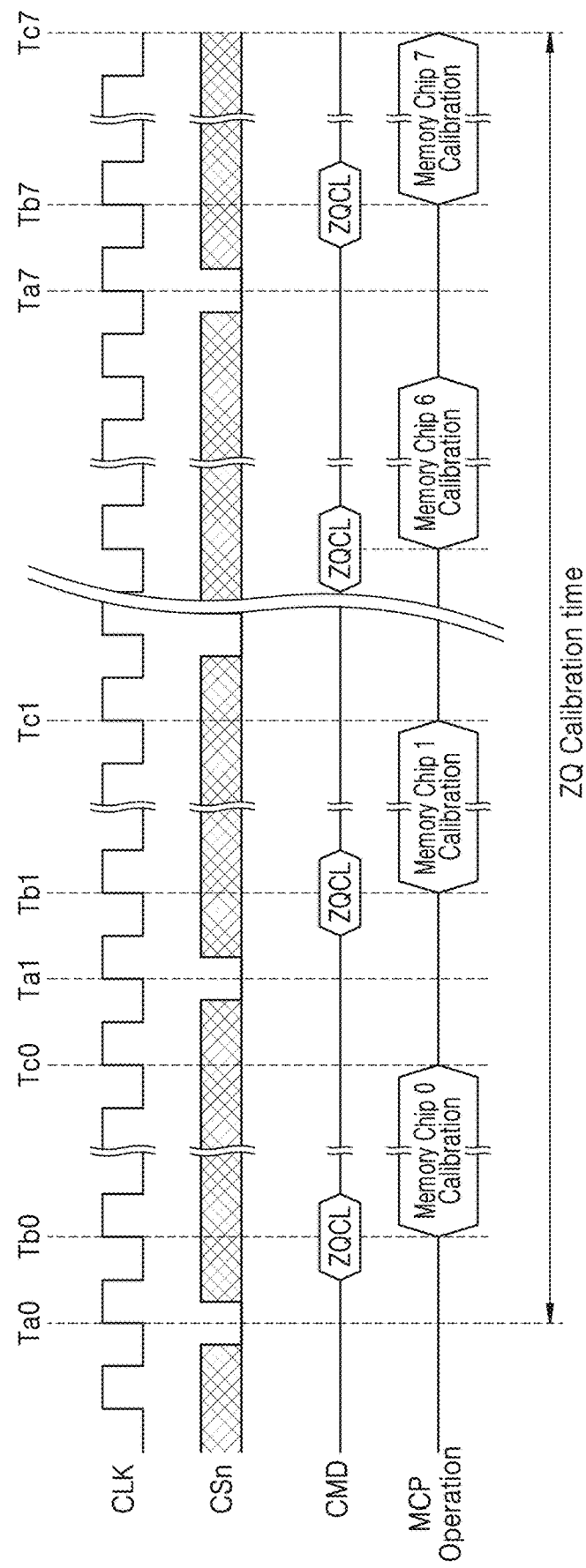

FIGS. 9A and 9B are diagrams for describing a ZQ calibration method of a multi-chip package of the related art. An example, where the ZQ calibration method of FIGS. 9A and 9B is performed by the multi-chip package 100 including the eight memory chips 141 to 148 as in FIG. 1, will be described below.

Referring to FIGS. 9A and 9B, a chip selection signal CSn for selecting one memory chip from among the memory chips 141 to 148 may be received in operation S910. For example, at a time Ta0, a chip selection signal CSn for selecting the first memory chip 141 may be applied to the first memory chip 141 in operation S910. At a time Tb0, a ZQ calibration command ZQCL corresponding to the first memory chip 141 may be received in operation S920. A ZQ calibration operation of the first memory chip 141 may be performed in response to the ZQ calibration command ZQCL in operation S930, and at a time Tc0, the ZQ calibration operation of the first memory chip 141 may end.

After the ZQ calibration operation of the first memory chip 141 ends, a chip selection signal CSn for selecting the second memory chip 142 may be applied to the second memory chip 142 at a time Ta1 in operation S910. At a time Tb1, a ZQ calibration command ZQCL corresponding to the second memory chip 141 may be received in operation S920, and a ZQ calibration operation of the second memory chip 142 may be performed in response to the ZQ calibration command ZQCL in operation S930. At a time Tc1, the ZQ calibration operation of the second memory chip 142 may end.

In this manner, ZQ calibration operations of the third to eighth memory chips 143 to 148 may be sequentially performed, and when a ZQ calibration operation of the eighth memory chip 148 ends at a time Tc7, the ZQ calibration operation of the multi-chip package 100 may end. That is, since the ZQ calibration operation is performed for each of the first to eighth memory chips 141 to 148, the ZQ calibration operation of the multi-chip package 100 may include eight ZQ calibration operations. The ZQ calibration method of the multi-chip package of the related art may have a problem where a long ZQ calibration time is taken in proportion to the number of stacked memory chips of the multi-chip package 100.

Figure 10:
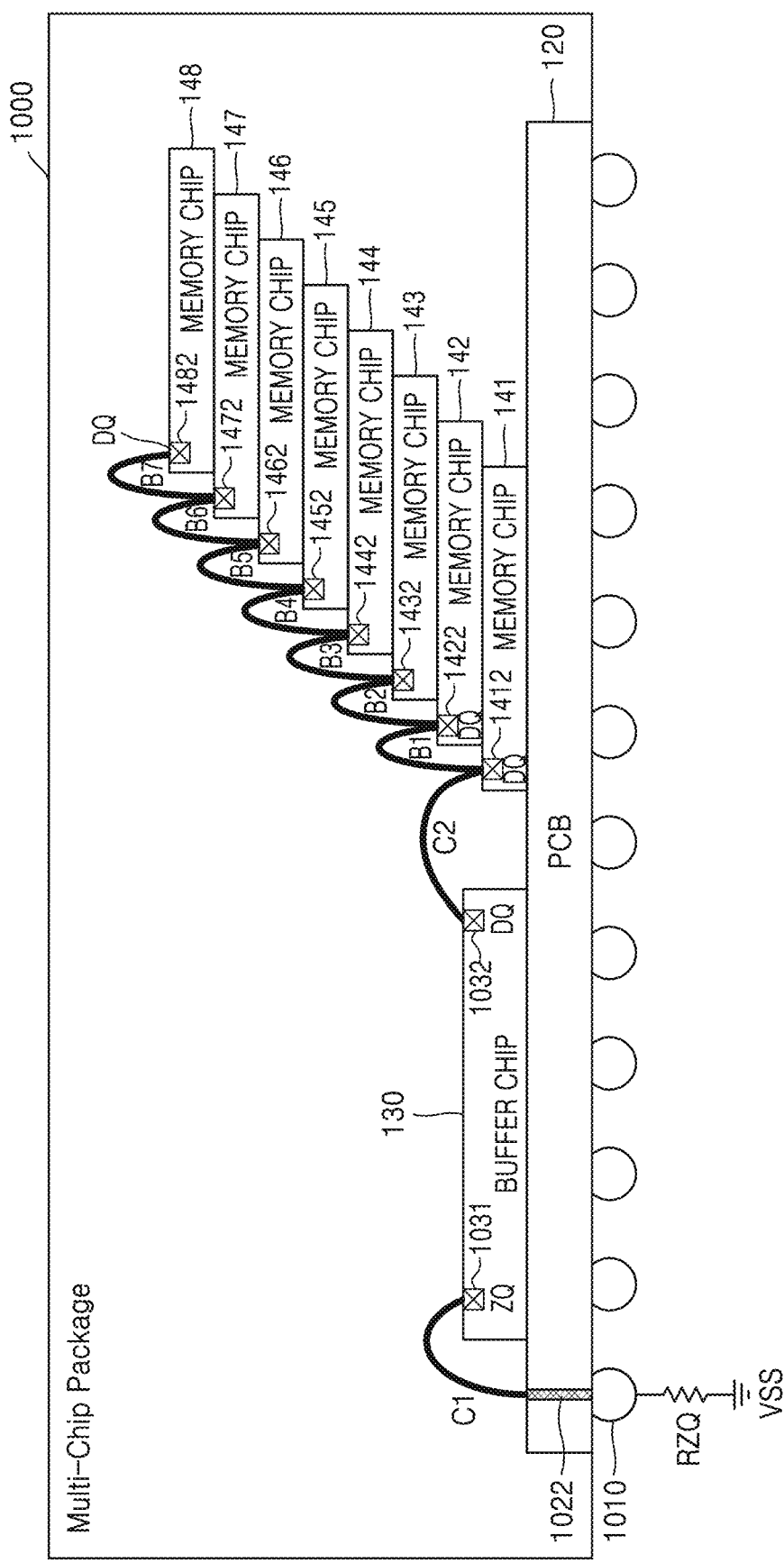
FIG. 10 is a diagram for describing a multi-chip package according to at least one example embodiment of the inventive concepts.

FIG. 10 is a diagram for describing a multi-chip package 1000 according to at least one example embodiment of the inventive concepts.

Referring to FIG. 10, the multi-chip package 1000 may include a buffer chip 130 and first to eighth memory chips 141 to 148, which are mounted on a PCB 120. The buffer chip 130 may be electrically connected to external terminals 1010 of the multi-chip package 1000 through a bonding wire C1. The buffer chip 130 may include a ZQ pad 1031 and a DQ pad 1032. The ZQ pad 1031 may be connected to a TSV 1022 and a conductive electrode of the PCB 120 through a bonding wire C1 and may be coupled to an external terminal 1010 of the multi-chip package 100. The external terminal 1010 connected to the ZQ pad 1031 may be a ZQ terminal. A resistor RZQ may be connected between the ZQ terminal 110 and a ground voltage VSS. The DQ pad 1032 may be connected to DQ pads 1412, 1422, 1432, 1442, 1452, 1462, 1472, and 1482 of the first to eighth memory chips 141 to 148 through a bonding wire C2. Hereinafter, description of the multi-chip package 1000 which is the same as or similar to the description of FIG. 1 is omitted.

The buffer chip 130 may control the first to eighth memory chips 141 to 148. The first to eighth memory chips 141 to 148 may perform a certain operation on the basis of control by the buffer chip 130. For example, the buffer chip 130 may operate as a memory controller. In controlling ZQ calibration operations of the DQ pads 1412, 1422, 1432, 1442, 1452, 1462, 1472, and 1482 of the first to eighth memory chips 141 to 148, the buffer chip 130 may operate like the first memory chip 141, which is the master chip, of FIG. 1. In this case, the first memory chip 141 may be a slave chip and may operate like the second to eighth memory chips 142 to 148.

Figure 11:
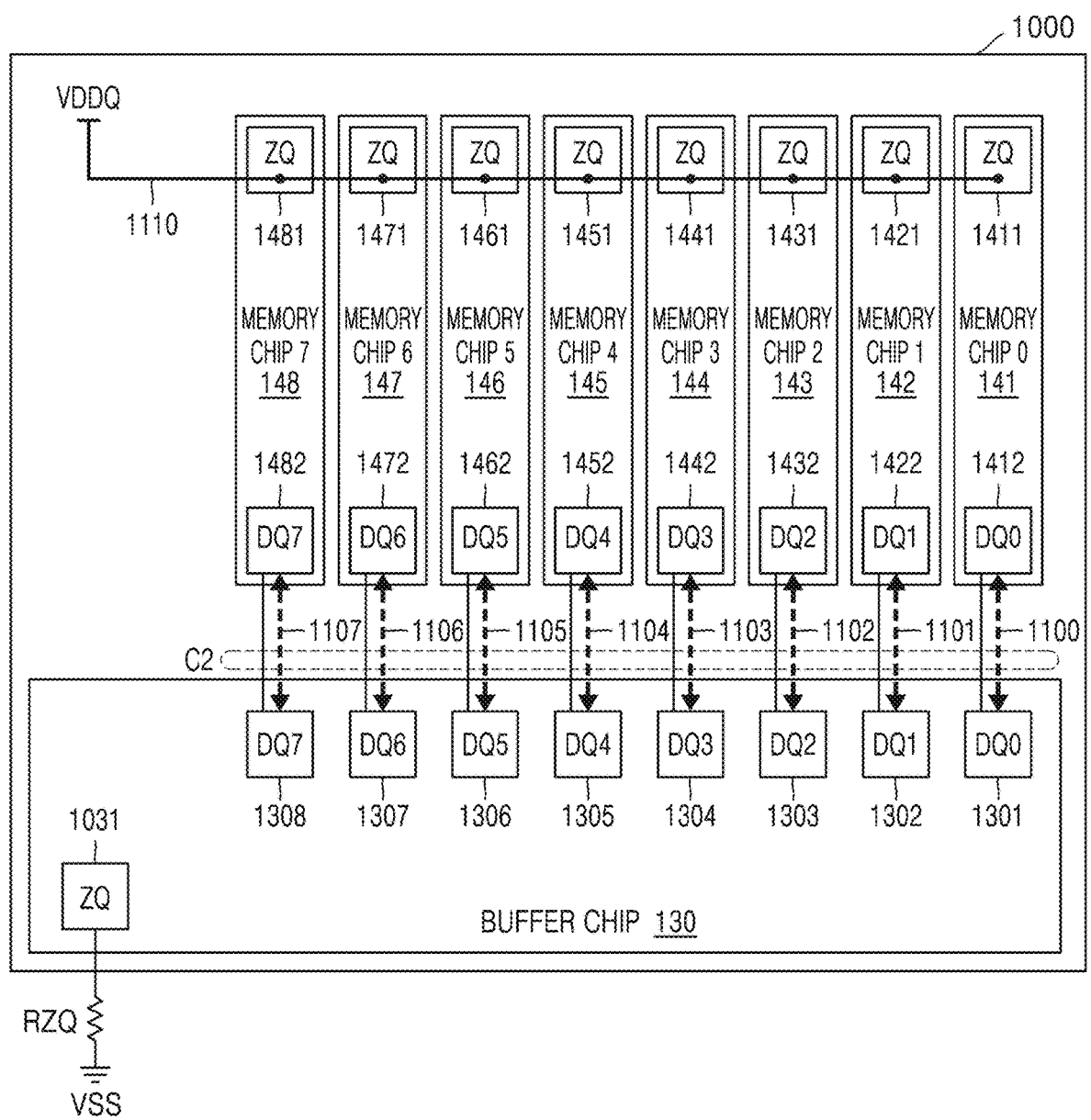
FIG. 11 is a diagram for describing a ZQ calibration method of the multi-chip package of FIG. 10 according to at least one example embodiment of the inventive concepts.

FIG. 11 is a diagram for describing a ZQ calibration method of the multi-chip package 1000 of FIG. 10 according to at least one example embodiment of the inventive concepts.

Referring to FIG. 11, a buffer chip 130 of a multi-chip package 1000 may include the same elements as those of the first memory chip 141 described above with reference to FIG. 4. However, the buffer chip 130 and first to eighth memory chips 141 to 148 may further include a DQ pad DQ7, in addition to DQ pads.

The buffer chip 130 may store a ZQ calibration option, representing each of one-to-one correspondence relationships between the DQ pads of the buffer chip 130 and the DQ pads of the first to eighth memory chips 141 to 148, in a register.

The buffer chip 130 may perform a ZQ calibration operation by using a resistor RZQ connected to a ZQ pad 1031, and termination resistance values of DQ pads 1301 to 1308 of the buffer chip 130 may be controlled and set based on a result obtained by performing the ZQ calibration operation.

When a ZQ calibration operation of the buffer chip 130 ends, each of the first to eighth memory chips 141 to 148 which are slave chips may perform a ZQ calibration operation coupled to a DQ pad of a corresponding slave memory chip by using a termination resistance value set to a corresponding DQ pad of the buffer chip 130. ZQ pads 1411, 1421, 1431, 1441, 1451, 1461, 1471, and 1481 of the first to eighth memory chips 141 to 148 may be connected to a VDDQ voltage line.

A ZQ calibration operation 1100 may be performed between a DQ0 pad 1301 of the buffer chip 130 and a DQ0 pad 1412 of the first memory chip 141 to control termination resistance values of DQ pads DQ0 to DQ7 of the first memory chip 141.

A ZQ calibration operation 1101 may be performed between a DQ1 pad 1302 of the buffer chip 130 and a DQ1 pad 1422 of the second memory chip 142 to control termination resistance values of DQ pads DQ0 to DQ7 of the second memory chip 142.

A ZQ calibration operation 1102 may be performed between a DQ2 pad 1303 of the buffer chip 130 and a DQ2 pad 1432 of the third memory chip 143 to control termination resistance values of DQ pads DQ0 to DQ7 of the third memory chip 143.

A ZQ calibration operation 1103 may be performed between a DQ3 pad 1304 of the buffer chip 130 and a DQ3 pad 1442 of the fourth memory chip 144 to control termination resistance values of DQ pads DQ0 to DQ7 of the fourth memory chip 144.

A ZQ calibration operation 1104 may be performed between a DQ4 pad 1305 of the buffer chip 130 and a DQ4 pad 1452 of the fifth memory chip 145 to control termination resistance values of DQ pads DQ0 to DQ7 of the fifth memory chip 145.

A ZQ calibration operation 1105 may be performed between a DQ5 pad 1306 of the buffer chip 130 and a DQ5 pad 1462 of the sixth memory chip 146 to control termination resistance values of DQ pads DQ0 to DQ7 of the sixth memory chip 146.

A ZQ calibration operation 1106 may be performed between a DQ6 pad 1307 of the buffer chip 130 and a DQ6 pad 1472 of the seventh memory chip 147 to control termination resistance values of DQ pads DQ0 to DQ7 of the seventh memory chip 147.

A ZQ calibration operation 1107 may be performed between a DQ7 pad 1308 of the buffer chip 130 and a DQ7 pad 1482 of the eighth memory chip 148 to control termination resistance values of DQ pads DQ0 to DQ7 of the eighth memory chip 148.

In the present embodiment, it is described that the number of stacked memory chips 141 to 148 of the multi-chip package 1000 is eight and the number of DQ pads DQ0 to DQ7 of the memory chips 141 to 148 is eight. When the number of DQ pads of memory chips is set to n number, n number of memory chips equal to the number of DQ pads may be stacked in the multi-chip package 1000 and ZQ calibration operations of all of the n DQ pads may be performed.

Figure 12:
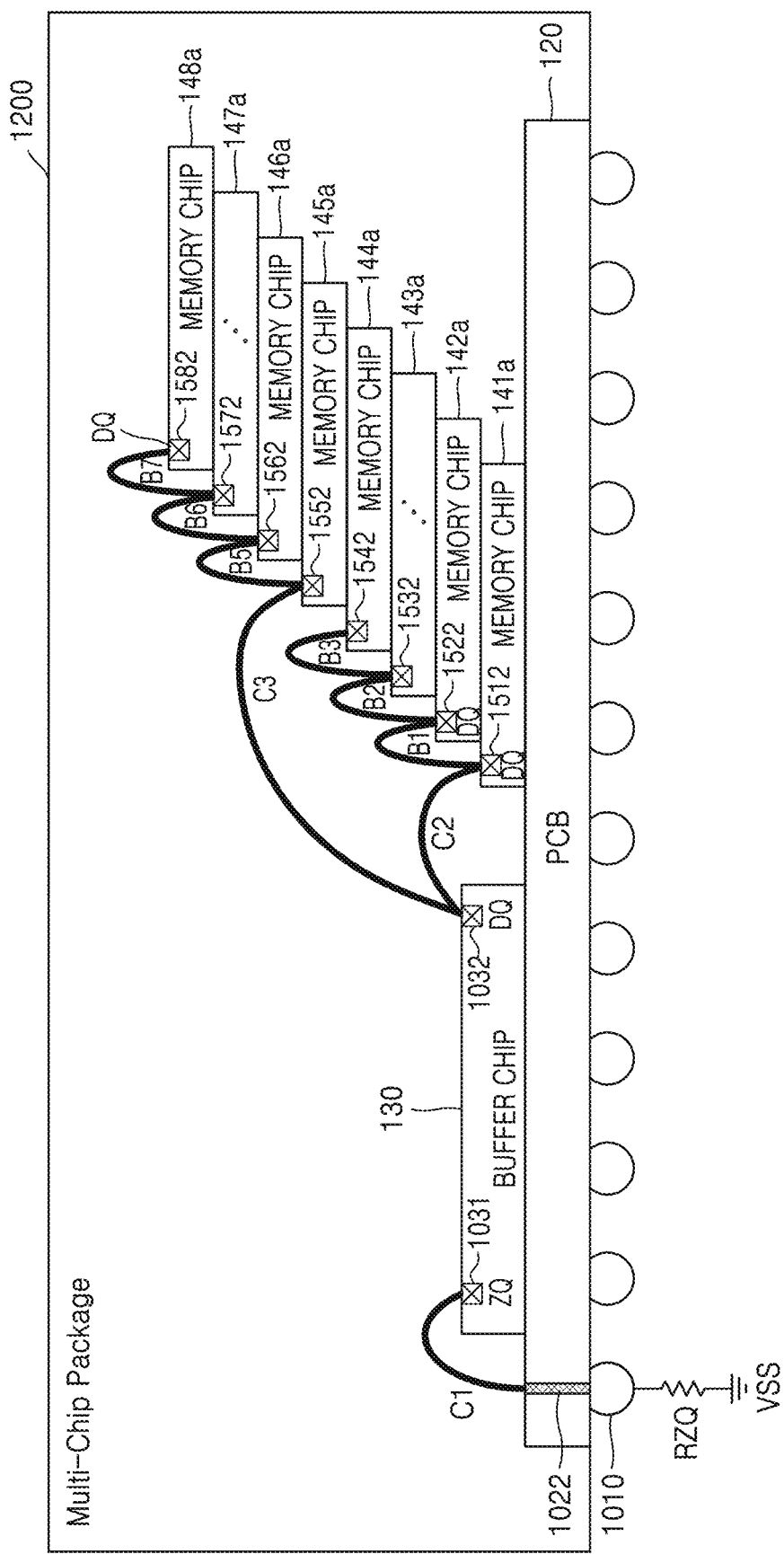
FIG. 12 is a diagram for describing a multi-chip package according to at least one example embodiment of the inventive concepts.

FIG. 12 is a diagram for describing a multi-chip package 1200 according to at least one example embodiment of the inventive concepts.

Referring to FIG. 12, comparing with the multi-chip package 1000 of FIG. 11, the multi-chip package 1200 may have a difference in that a plurality of memory chips 141a to 148a are grouped into a first group and a second group and are connected to a buffer chip 130. Hereinafter, description of the multi-chip package 1200 which is the same as or similar to the descriptions of FIGS. 1 and 11 is omitted.

When the number of stacked memory chips of the multi-chip package 1200 increases, the number of memory chips connected to a DQ pad 1032 of the buffer chip 130 may increase. Due to this, a load of the DQ pad 1032 of the buffer chip 130 may increase, and instability may increase. The load of the DQ pad 1032 may not be suitable for accurate ZQ calibration operations of memory chips connected to the DQ pad 1032 of the buffer chip 130. The load of the DQ pad 1032 of the buffer chip 130 may be controlled to a certain level suitable for the accurate ZQ calibration operations of memory chips.

DQ pads 1512, 1522, 1532, and 1542 of the memory chips 141a to 144a of the first group may be connected to the DQ pad 1032 of the buffer chip 130 through a first bonding wire C2. DQ pads 1552, 1562, 1572, and 1582 of the memory chips 145a to 148a of the second group may be connected to the DQ pad 1032 of the buffer chip 130 through a second bonding wire C3. In the present embodiment, it is described that the plurality of memory chips 141a to 148a are grouped into two groups. However, this is merely an embodiment, and the number of groups is not limited thereto.

The buffer chip 130 may perform a ZQ calibration operation by using a resistor RZQ connected to a ZQ pad 1031, and termination resistance values of the DQ pad 1302 of the buffer chip 130 may be controlled and set based on a result obtained by performing the ZQ calibration operation.

When a ZQ calibration operation of the buffer chip 130 ends, a first ZQ calibration operation of each of the memory chips 141a to 144a of the first group and a second ZQ calibration operation of each of the memory chips 145a to 148a of the second group may be simultaneously performed. In the first ZQ calibration operation, a ZQ calibration operation coupled to a DQ pad of each of the memory chips 141a to 144a of the first group may be performed by using a termination resistance value set to a corresponding DQ pad of the buffer chip 130. In the second ZQ calibration operation, a ZQ calibration operation coupled to a DQ pad of each of the memory chips 145a to 148a of the second group may be performed by using a termination resistance value set to a corresponding DQ pad of the buffer chip 130.

According to at least one example embodiment of the inventive concepts, the ZQ calibration operation of the buffer chip 130 may end, and then, the first ZQ calibration operation of each of the memory chips 141a to 144a of the first group and the second ZQ calibration operation of each of the memory chips 145a to 148a of the second group may be performed in parallel. In other embodiments, the first ZQ calibration operation and the second ZQ calibration operation may be performed sequentially.

Figure 13:
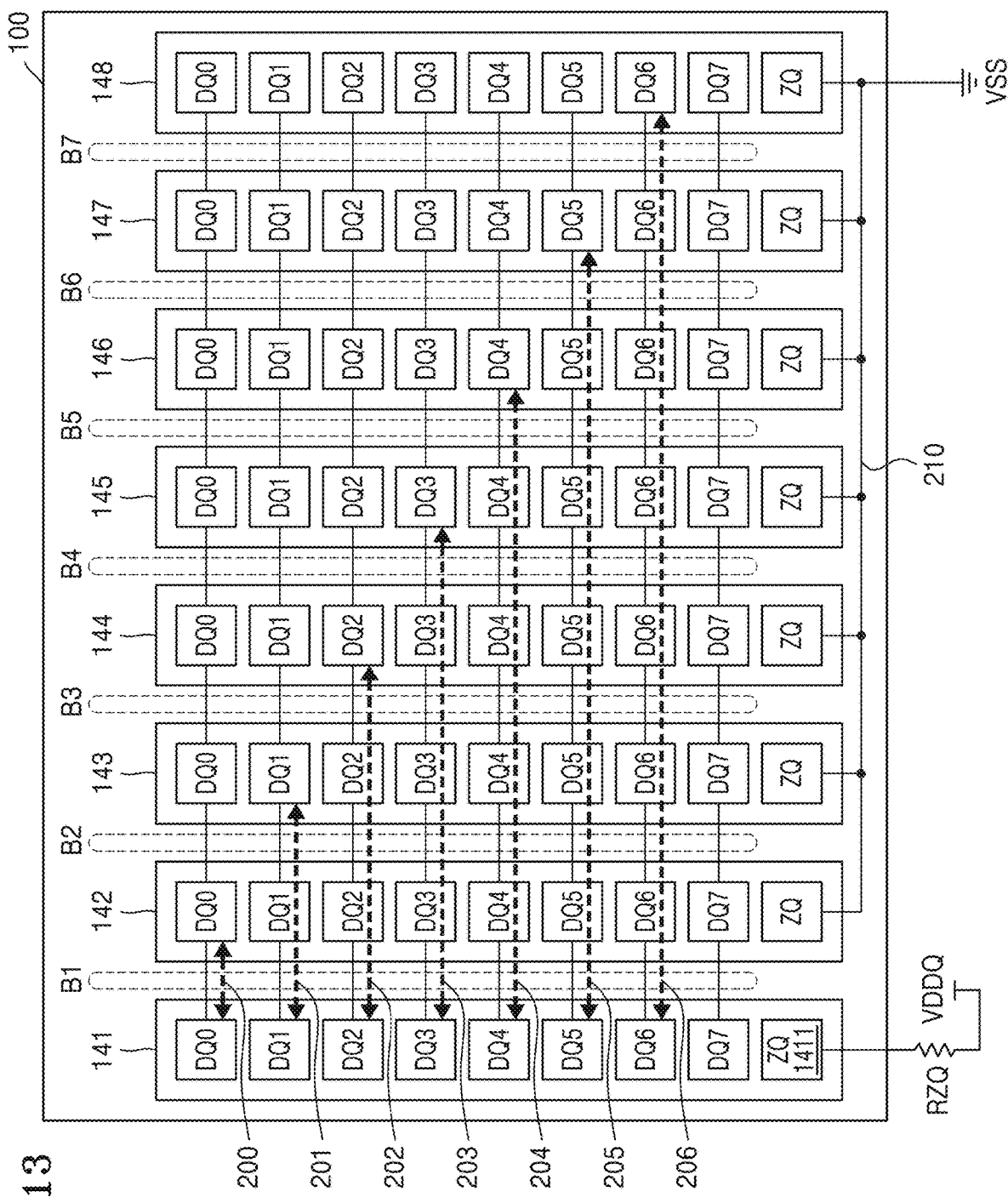
FIG. 13 is a diagram for describing a ZQ calibration method of the multi-chip package of FIG. 1 according to at least one example embodiment of the inventive concepts.

FIG. 13 is a diagram for describing a ZQ calibration method of the multi-chip package 100 of FIG. 1 according to at least one example embodiment of the inventive concepts.

Referring to FIG. 13, comparing with FIG. 2, there may be a difference in that the other end of the resistor RZQ connected to the ZQ pad 1411 of the first memory chip 141 is connected to a source voltage VDDQ line and ZQ pads of the second to eighth memory chips 142 to 148 are connected to the signal line (or ground voltage line) 210 connected to the ground voltage VSS. Hereinafter, description of the multi-chip package 100 which is the same as or similar to the description of FIG. 2 is omitted.

The first memory chip 141 which is a master chip may perform a first ZQ calibration operation by using the resistor RZQ connected to the ZQ pad 1411 to control termination resistance values of the DQ pads DQ0 to DQ6 of the first memory chip 141. Second ZQ calibration operations of slave memory chips may be simultaneously performed based on a ZQ calibration option set between the DQ pads DQ0 to DQ6 of the first memory chip 141 and DQ pads DQ0 to DQ7 of the second to eighth memory chips 142 to 148 which are the slave memory chips.

In the second ZQ calibration operations, the second memory chip 142 which is a first slave memory chip may perform a ZQ calibration operation coupled to the DQ pad DQ0 of the second memory chip 142 by using a termination resistance value of the DQ pad DQ0 of the first memory chip 141 to control termination resistance values of the DQ pads DQ0 to DQ6 of the second memory chip 142. The third memory chip 143 which is a second slave memory chip may perform a ZQ calibration operation coupled to the DQ pad DQ1 of the third memory chip 143 by using a termination resistance value of the DQ pad DQ1 of the first memory chip 141 to control termination resistance values of the DQ pads DQ0 to DQ6 of the third memory chip 143. In this manner, the eighth memory chip 148 which is a seventh slave memory chip may perform a ZQ calibration operation coupled to the DQ pad DQ6 of the eighth memory chip 148 by using a termination resistance value of the DQ pad DQ6 of the first memory chip 141 to control termination resistance values of the DQ pads DQ0 to DQ6 of the eighth memory chip 148.

Figure 14:
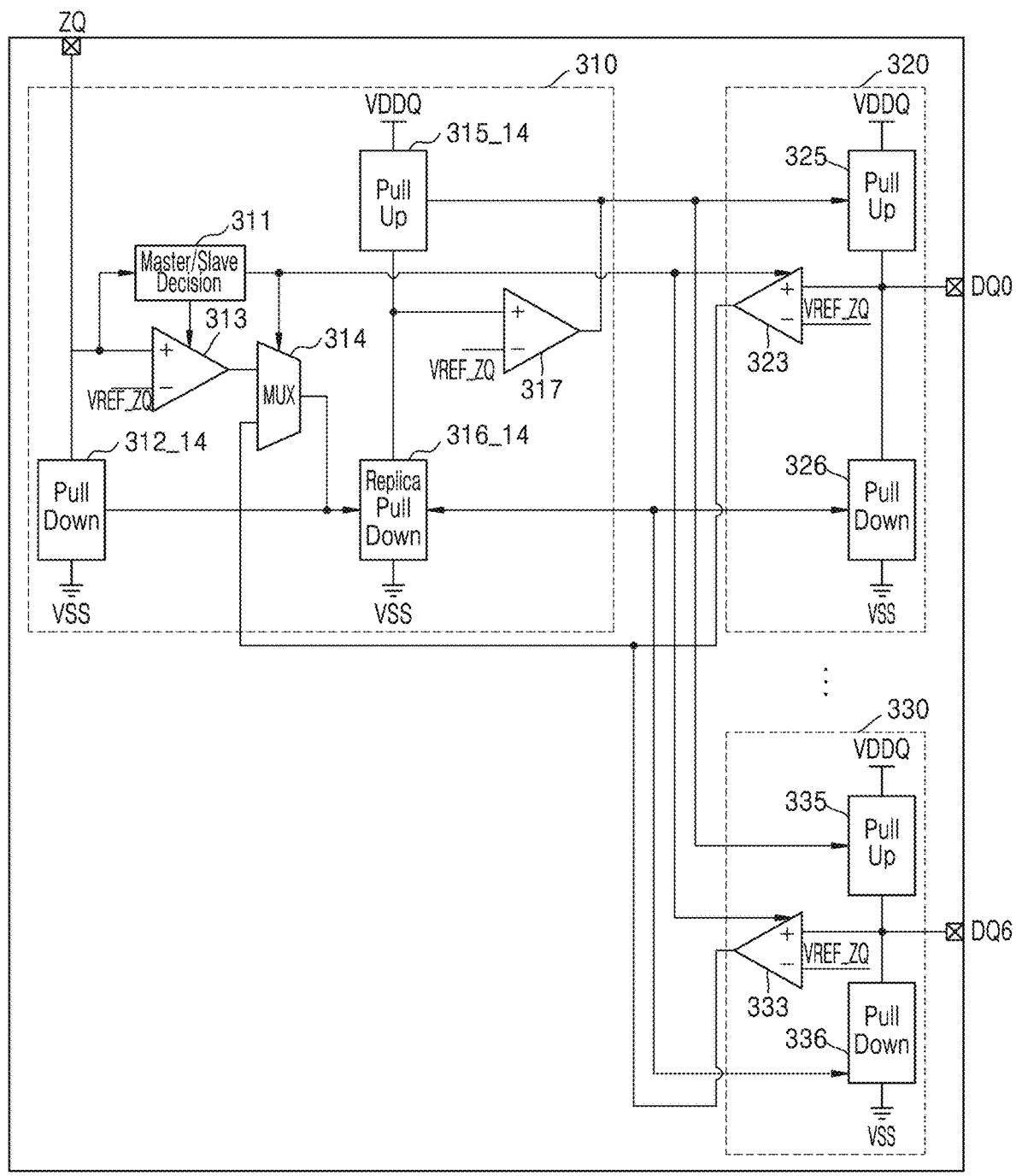
FIG. 14 is a block diagram for describing memory chips of FIG. 13 according to at least one example embodiment of the inventive concepts.

FIG. 14 is a block diagram for describing the memory chips 141 to 148 of FIG. 13 according to at least one example embodiment of the inventive concepts.

Referring to FIG. 14, comparing with FIG. 3, each of the memory chips 141 to 148 may have a difference in that a ZQ engine 310 for performing a pull-up calibration operation and a pull-down calibration operation includes a first pull-down unit 312_14, a pull-up unit 315_14, and a second pull-down unit 316_14, instead of the first pull-up unit 312, the second pull-up unit 315, and the pull-down unit 316. The first pull-down unit 312_14, a pull-up unit 315_14, and a second pull-down unit 316_14 may each be embodied by a circuit or circuitry. Hereinafter, descriptions of the memory chips 141 to 148 which are the same as or similar to the descriptions of FIG. 3 are omitted.

A master/slave determiner 311 may detect a voltage level of a ZQ pad of a corresponding memory chip to determine whether the corresponding memory chip is a master chip or a slave chip. When a voltage level of the ZQ pad is a VSS voltage level (e.g., the ground voltage level), the master/slave determiner 311 may determine the corresponding memory chip as the slave chip. When the voltage level of the ZQ pad is not the VSS voltage level (e.g., the ground voltage level), the master/slave determiner 311 may determine the corresponding memory chip as the master chip. The master/slave determiner 311 may store a ZQ calibration option representing each of one-to-one correspondence relationships 200 to 206 performing a ZQ calibration operation between DQ pads DQ0 to DQ6 of the master chip and the DQ pads DQ0 to DQ6 of the slave chips.

When it is determined by the master/slave determiner 311 that the corresponding memory chip is the master chip, a first comparator 313 may compare a voltage of the ZQ pad with a reference voltage VREF_ZQ. The reference voltage VREF_ZQ may have a voltage level corresponding to half (VDDQ/2) of the VDDQ voltage level (e.g., the source voltage level).

An output of the first comparator 313 may be provided as a first input of a multiplexer 314. An output of each of comparators 323 and 333 of I/O drivers 320 and 330 may be provided as a second input of the multiplexer 314. When it is determined by the master/slave determiner 311 that the corresponding memory chip is the master chip, the multiplexer 314 may output the output of the first comparator 313 input as the first input thereof, and when it is determined by the master/slave determiner 311 that the corresponding memory chip is the slave chip, the multiplexer 314 may output the output of each of the comparators 323 and 333 of the I/O drivers 320 and 330 input as the second input thereof.

The first pull-down unit 312_14 may perform a pull-down calibration operation on the basis of the output of the first comparator 313. The first pull-down unit 312_14 may generate a pull-down calibration code on the basis of the output of the first comparator 313, and in this case, the pull-down calibration operation may be performed by varying the pull-down calibration code until a voltage of the ZQ pad is equal to the reference voltage VREF_ZQ. The first pull-down unit 312_14 may provide the second pull-down unit 316_14 and pull-down units 326 and 336 of the I/O drivers 320 and 330 with the pull-up calibration code at a time when the voltage of the ZQ pad is equal to the reference voltage VREF_ZQ.

The second pull-down unit 316_14 may have substantially the same configuration as that of the first pull-down unit 312_14. An impedance of the second pull-down unit 316_14 may be controlled based on the pull-down calibration code. Therefore, the impedance of the second pull-down unit 316_14 may be substantially the same as that of the first pull-down unit 312_14.

The second comparator 317 may compare the reference voltage VREF_ZQ with a voltage of a connection node between the second pull-down unit 316_14 and the pull-up unit 315_14.

The pull-up unit 315_14 may perform a pull-up calibration operation on the basis of the output of the second comparator 317. The pull-up unit 315_14 may generate a pull-up calibration code on the basis of an output of the second comparator 317, and in this case, a pull-up calibration operation may be performed by varying the pull-up calibration code until the voltage of the connection node between the second pull-down unit 316_14 and the pull-up unit 315_14 is equal to the reference voltage VREF_ZQ. The pull-up unit 315_14 may provide the pull-up units 325 and 335 of the I/O drivers 320 and 330 with the pull-up calibration code at a time when the voltage of the connection node between the second pull-down unit 316_14 and the pull-up unit 315_14 is equal to the reference voltage VREF_ZQ.

The pull-up/pull-down calibration codes generated by the ZQ engine 310 may be provided to the I/O drivers 320 and 330 connected to the DQ pads DQ0 to DQ7, and thus, termination resistance values of the DQ pads DQ0 to DQ7 may be controlled.

Figure 15:
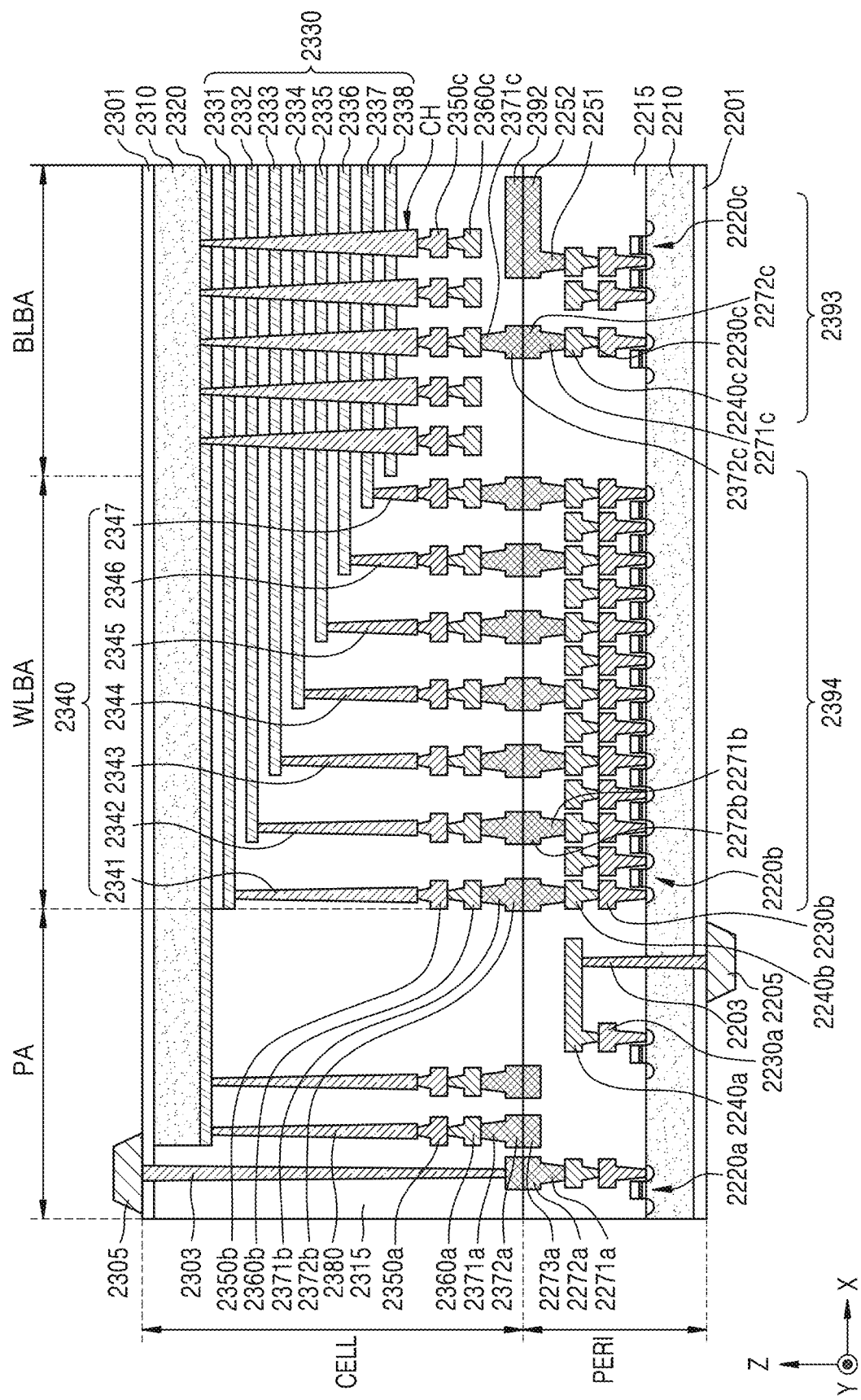
FIGS. 15 and 16 are cross-sections of a portion of the memory chip of FIG. 3.
Figure 16:
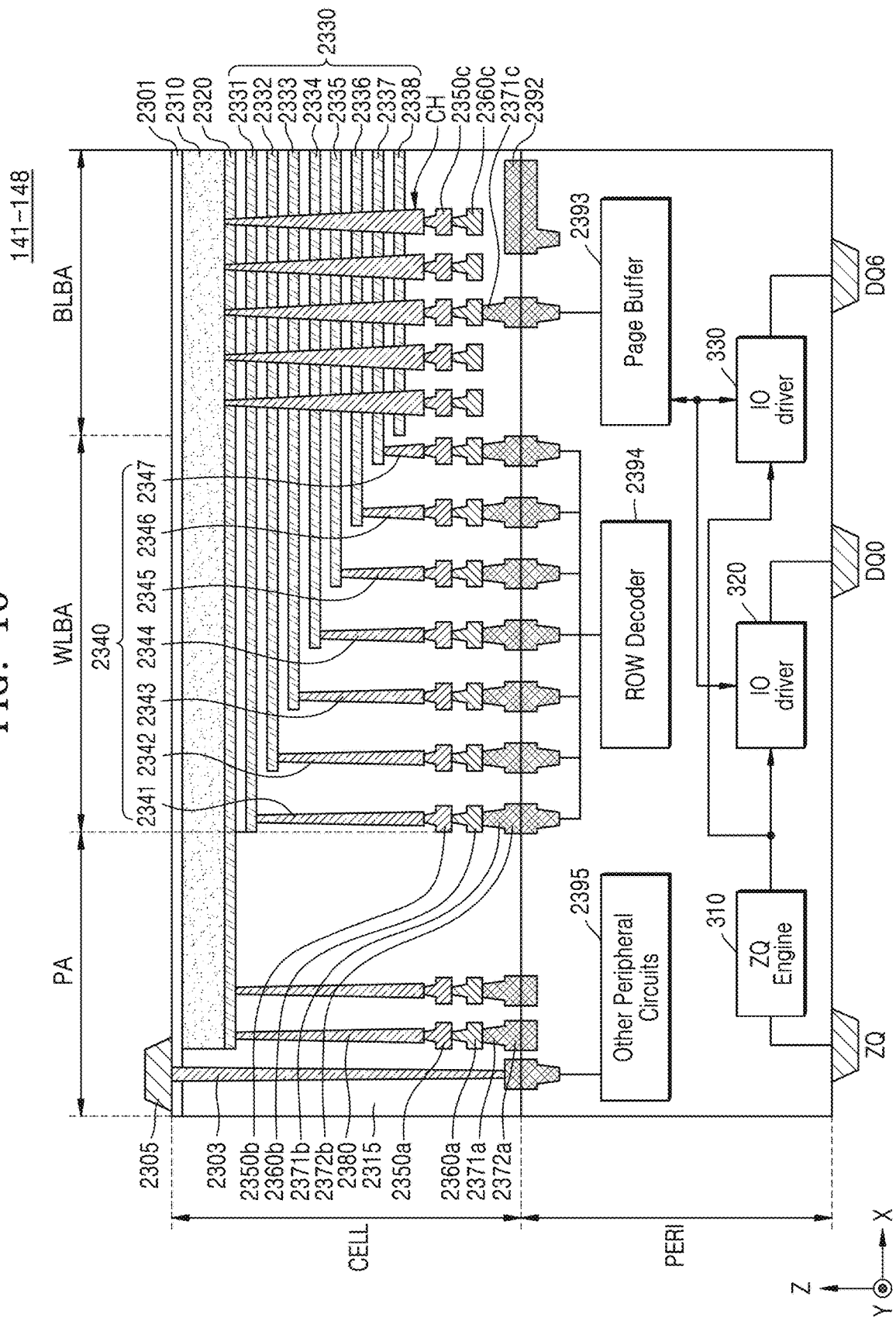

FIGS. 15 and 16 are cross-sections of a portion of the memory chip of FIG. 3.

Referring to FIGS. 3 and 15, each of the memory chips 141 to 148 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of each of the memory chips 141 to 148 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrate in FIG. 15, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 15, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 15, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 15, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 15, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, each of the memory chips 141 to 148 may include only the first input-output pad 2205 disposed on the first substrate 2210 or the second input-output pad 2305 disposed on the second substrate 2310. Alternatively, each of the memory chips 141 to 148 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, each of the memory chips 141 to 148 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

According to at least one example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Referring to FIGS. 3 and 16, the peripheral circuit region PERI may include the ZQ engine 310, the plurality of I/O drivers 320 and 330, the ZQ pad, and the DQ pads DQ0 to DQ6. The peripheral circuit region PERI may further include the row decoder 2394, the page buffer 2393 and other peripheral circuits 2395.

The ZQ engine 310 in the peripheral circuit region PERI may perform a ZQ calibration operation on a corresponding memory chip. The ZQ calibration operation may include a pull-up calibration operation and a pull-down calibration operation to generate the pull-up/pull-down calibration codes. The pull-up/pull-down calibration codes are provided to the plurality of I/O drivers 320 and 330.

The plurality of I/O drivers 320 and 330 connected to the DQ pads DQ0 to DQ6 in the peripheral circuit region PERI may control termination resistance values (e.g., pull-up and/or pull-down termination resistance values) of the DQ pads DQ0 to DQ6.

The ZQ pad and the DQ pads DQ0 to DQ6 may be the input-output pads 2305 and 2205 in the external pad bonding area PA.

Figure 17:
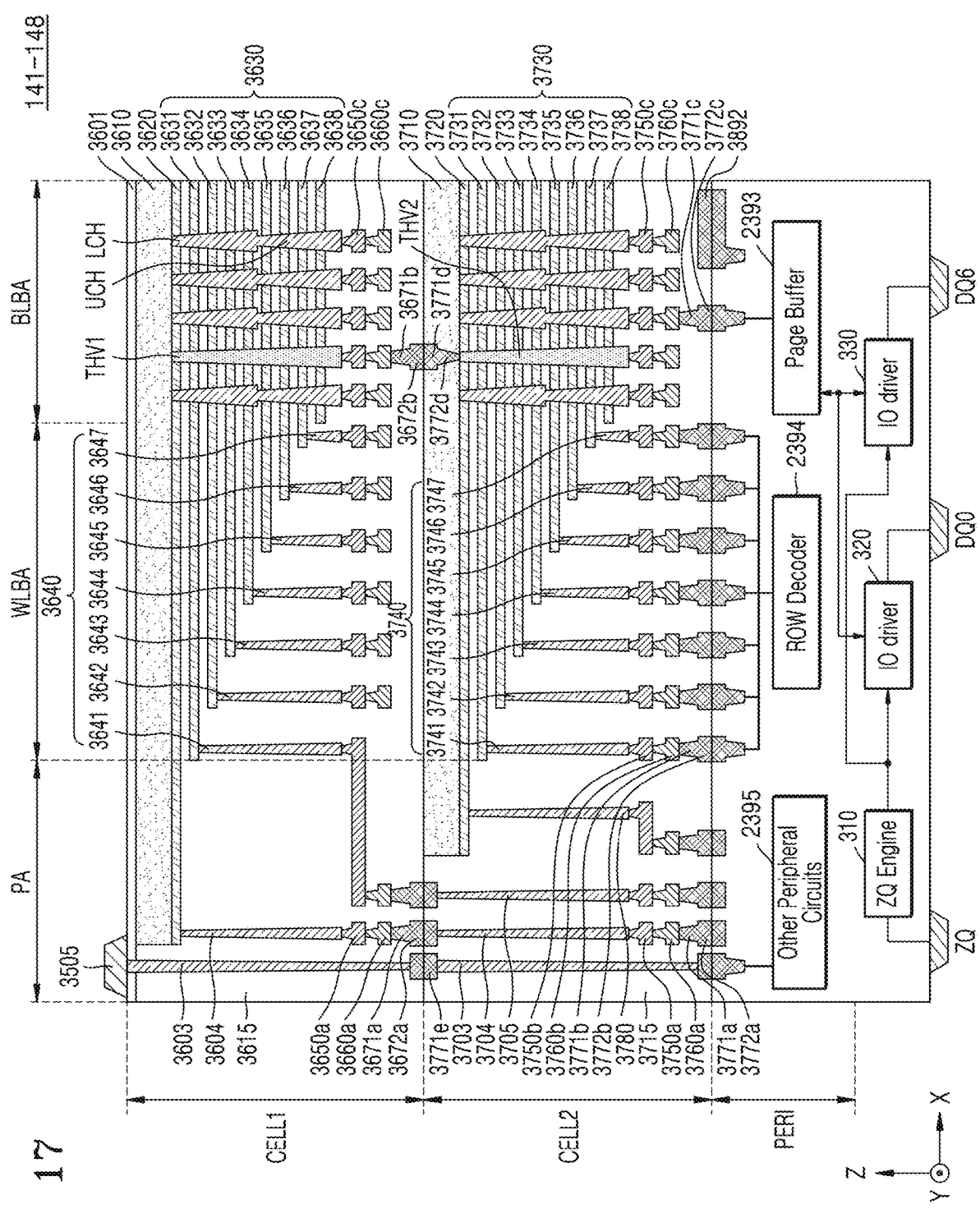
FIG. 17 illustrates a memory device having a chip-to-chip (C2C) structure, according to exemplary embodiments of the inventive concepts.

FIG. 17 illustrates a memory device having a chip-to-chip (C2C) structure, according to exemplary embodiments of the inventive concepts.

Referring to FIG. 17, unlike FIG. 15, each of the memory chips 141 to 148 may include two or more upper chips, each including a cell region. For example, each of the memory chips 141 to 148 may include a first upper chip including a first cell region CELL1, a second upper chip including a second cell region CELL2, and a lower chip including a peripheral circuit region PERI. The first upper chip, the second upper chip and the lower chip may be connected by a bonding method. However, the number of upper chips is not limited to thereto. Hereinafter, the above-described description through FIG. 15 may be omitted. Hereinafter, the cell region CELL may refer to at least one of the first cell region CELL1 and the second cell region CELL2.

The cell region CELL may include a lower channel LCH and an upper channel UCH connected to each other in the bit lie bonding area BLBA. The lower channel LCH and the upper channel UCH may form one channel structure. Unlike the channel structure CH of FIG. 15, the channel structure CH of FIG. 17 may be formed through a process for the lower channel LCH and a process for the upper channel UCH. In the first cell area CELL1, the lower channel LCH extends in a direction perpendicular to the upper surface of the third substrate 3610 to penetrate the common source line 3620 and lower word lines 3631 to 3634. The lower channel LCH may include a data storage layer, a channel layer and a buried insulating layer, and may be connected to the upper channel UCH. The upper channel UCH may penetrate the upper word lines 3635 to 3638. The upper channel UCH may include a data storage layer, a channel layer and a buried insulating layer, and the channel layer of the upper channel UCH may be electrically connected to the first metal layer 3650c and the second metal layer 3660c. As the length of the channel increases, it may be difficult to form the channel having a constant width for process reasons. Each of the memory chips 141 to 148 according to an exemplary embodiment of the present disclosure may include a channel having improved width uniformity through the lower channel LCH and the upper channel UCH formed in a sequential process.

As described above with reference to FIG. 17, string select lines and ground select lines may be arranged on upper and lower portions of the word lines 3630 and 730, respectively. According to an exemplary embodiment of the present disclosure, a word line adjacent to the string select line or a word line adjacent to the ground select line may be a dummy word line. In the each of the memory chips 141 to 148 according to an embodiment, a word line placed near a boundary between the lower channel LCH and the upper channel UCH may be a dummy word line. For example, the word line 3634 and the word line 3635 forming the boundary between the lower channel LCH and the upper channel UCH may be dummy word lines.

In the bit line bonding region BLBA, the first cell region CELL1 may include a first through electrode THV1, and the second cell region CELL2 may include a second through electrode THV2. The first through electrode THV1 may penetrate the common source line 3620 and the plurality of word lines 3630. The first through electrode THV1 may further penetrate the third substrate 3610. The first through electrode THV1 may include a conductive material. Alternatively, the first through electrode THV1 may include a conductive material surrounded by an insulating material. The second through electrode THV1 may be the same as the first through electrode THV1. The first through electrode THV1 and the second through electrode THV2 may be electrically connected through the first through upper metal pattern 3672b and the second through lower metal pattern 3771d. The first through upper metal pattern 3672b may be formed on the top of the first upper chip including the first cell region CELL1, and the second through lower metal pattern 3771d may be formed on the bottom of the second upper chip including the second cell region CELL2. The first through electrode THV1 may be electrically connected to the first metal layer 3650c and the second metal layer 3660c. A first through via 3671b may be formed between the second metal layer 3660c and the first through upper metal pattern 3672b. A second through via 3772d may be formed between the second through electrode THV2 and the second through lower metal pattern 3771d. The first through upper metal pattern 3672b and the second through lower metal pattern 3771d may be connected in a bonding manner.

According to an embodiment of the present disclosure, a first upper metal pattern 3672a may be formed on the top of the first cell region CELL1, and a first lower metal may be formed on the bottom of the second cell region CELL2. The first upper metal pattern 3672a of the first cell region CELL1 and the first lower metal pattern 3771e of the second cell region CELL2 may be connected in the external pad bonding region PA by a bonding method. A second upper metal pattern 3772a may be formed on the top of the second cell region CELL2, and a second lower metal pattern 873a may be formed on the bottom of the peripheral circuit region PERI. The second upper metal pattern 3772a of the second cell region CELL2 and the second lower metal pattern 873a of the peripheral circuit region PERI may be connected in the external pad bonding region PA by a bonding method.

Referring to FIGS. 3 and 17, the peripheral circuit region PERI may include the ZQ engine 310, the plurality of I/O drivers 320 and 330, the ZQ pad, and the DQ pads DQ0 to DQ6. The peripheral circuit region PERI may further include the row decoder 2394, the page buffer 2393 and other peripheral circuits 2395.

The ZQ engine 310 in the peripheral circuit region PERI may perform a ZQ calibration operation on a corresponding memory chip. The ZQ calibration operation may include a pull-up calibration operation and a pull-down calibration operation to generate the pull-up/pull-down calibration codes. The pull-up/pull-down calibration codes are provided to the plurality of I/O drivers 320 and 330.

The plurality of I/O drivers 320 and 330 connected to the DQ pads DQ0 to DQ6 in the peripheral circuit region PERI may control termination resistance values (e.g., pull-up and/or pull-down termination resistance values) of the DQ pads DQ0 to DQ6.

The ZQ pad and the DQ pads DQ0 to DQ6 may be the input-output pads 2305 and 2205 in the external pad bonding area PA.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A multi-chip package comprising:
   a printed circuit board; and
   a plurality of memory chips stacked on the printed circuit board and including:
     a master memory chip; and
     a plurality of slave memory chips,
   wherein each of the plurality of memory chips includes:
     a memory cell region including a first metal pad;
     a peripheral circuit region including a second metal pad and being vertically connected to the memory cell region by the first metal pad and the second metal pad;
     an impedance control (ZQ) pad; and
     a plurality of data input/output (DQ) pads,
   wherein the master memory chip is configured to perform a first ZQ calibration operation on a ZQ pad of the master memory chip using a ZQ resistor connected to a ZQ terminal of the multi-chip package and control termination resistance values of the plurality of DQ pads of the master memory chip based on the first ZQ calibration operation, and
   wherein each slave memory chip of the plurality of slave chips is configured to perform second ZQ calibration operations on DQ pads of first to $m^{th}$ slave memory chips of the plurality of slave memory chips based on termination resistance values of first to $m^{th}$ DQ pads of the plurality of DQ pads of the master memory chip based on a ZQ calibration option set between the first to $m^{th}$ DQ pads of the master memory chip and the DQ pads of the first to $m^{th}$ slave memory chips, m being an integer greater than 1.

2. The multi-chip package of claim 1, wherein:
the master memory chip further includes a ZQ calibration circuit in the peripheral circuit region, and
the plurality of slave chips are configured to simultaneously perform the second ZQ calibration operations.

3. The multi-chip package of claim 2, wherein the plurality of slave memory chips are configured such that a time for completing the second ZQ calibration operations performed by the plurality of slave memory chips is shorter than two times a time for completing a second ZQ calibration operation performed by one slave memory chip amongst the plurality of slave memory chips.

4. The multi-chip package of claim 1, wherein the ZQ pad of each slave memory chip is connected to a source voltage line or a ground voltage line.

5. The multi-chip package of claim 1, wherein the first to $m^{th}$ DQ pads of the master memory chip are respectively connected to first to $m^{th}$ pads of each of the first to $m^{th}$ slave memory chips.

6. The multi-chip package of claim 1, wherein the ZQ calibration option is stored in a register of the master memory chip.

7. The multi-chip package of claim 1, wherein the ZQ calibration option is stored in a register of each of the plurality of memory chips.

8. The multi-chip package of claim 1, wherein:
each of the plurality of memory chips includes a ZQ engine connected to the ZQ pad, and
the ZQ engine included in each of the plurality of memory chips comprises:
a master/slave determiner circuit configured to detect a voltage level of the ZQ pad and compare the detected voltage level of the ZQ pad with a source voltage level or a ground voltage level to determine whether a corresponding memory chip is the master memory chip or one of the plurality of slave memory chips;
a first comparator configured to compare the voltage level of the ZQ pad with a reference voltage level based on the master/slave determiner circuit determining that the corresponding memory chip is the master memory chip;
a second comparator;
a multiplexer configured to provide, as a first input, an output of the first comparator in the master memory chip and provide, as a second input, an output of a third comparator of each of DQ drivers connected to the DQ pads in the plurality of slave memory chips;
a first pull-up circuitry configured to perform a pull-up calibration operation that includes generating a pull-up calibration code on the basis of an output of the multiplexer; and
a second pull-up circuitry of which an impedance is controllable to be equal to an impedance of the first pull-up circuitry on the basis of the pull-up calibration code, the second comparator being configured to compare the reference voltage level with a voltage level of a connection node between the second pull-up circuitry and first pull-down circuitry, the first pull-down circuitry being configured to perform a pull-down calibration operation of generating a pull-down calibration code based on the an output of the second comparator.

9. The multi-chip package of claim 8, wherein the ZQ calibration option is stored in the master/slave determiner circuit.

10. The multi-chip package of claim 8, wherein each of the DQ drivers comprises:
a third pull-up circuitry configured to control a pull-up termination resistance of each of the DQ pads based on the pull-up calibration code; and
a second pull-down circuitry configured to control a pull-down termination resistance based on the pull-down calibration code, the third comparator being configured to compare a voltage level of each of the DQ pads with the reference voltage level.

11. The multi-chip package of claim 1, wherein the memory cell region is formed on a first wafer and the peripheral circuit region is formed on a second wafer.

* * * * *